(12) United States Patent
Park et al.

(10) Patent No.: US 12,401,907 B2
(45) Date of Patent: Aug. 26, 2025

(54) ELECTRONIC DEVICE INCLUDING FOLDED CAMERA MODULE FOR FLARE COMPENSATION AND CONTROL METHOD THEREOF

(71) Applicant: Samsung Electronics Co., Ltd., Suwon-si (KR)

(72) Inventors: Jaehyoung Park, Suwon-si (KR); Jonghun Won, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 150 days.

(21) Appl. No.: 18/324,325

(22) Filed: May 26, 2023

(65) Prior Publication Data

US 2023/0388648 A1 Nov. 30, 2023

Related U.S. Application Data

(63) Continuation of application No. PCT/KR2023/007306, filed on May 26, 2023.

(30) Foreign Application Priority Data

May 27, 2022 (KR) .................. 10-2022-0065178
Oct. 21, 2022 (KR) .................. 10-2022-0136864

(51) Int. Cl.
*H04N 23/71* (2023.01)
*G06T 5/80* (2024.01)
*H04N 23/55* (2023.01)

(52) U.S. Cl.
CPC .............. *H04N 23/71* (2023.01); *G06T 5/80* (2024.01); *H04N 23/55* (2023.01)

(58) Field of Classification Search
CPC ........ H04N 23/71; H04N 23/55; H04N 23/54; H04N 23/57; H04N 23/67; H04N 23/672;
(Continued)

(56) References Cited

U.S. PATENT DOCUMENTS 9,936,121 B2 * 4/2018 Kawakami ................ G06T 5/50
2004/0130647 A1 7/2004 Kuba
(Continued)

FOREIGN PATENT DOCUMENTS

JP 2000-121944 4/2000
JP 2004-205796 7/2004
(Continued)

OTHER PUBLICATIONS

Search Report dated Sep. 1, 2023 in International Patent Application No. PCT/KR2023/007306.
(Continued)

*Primary Examiner* — Padma Haliyur
(74) *Attorney, Agent, or Firm* — Nixon & Vanderhye, P.C.

(57) ABSTRACT

An aspect of the disclosure provides an electronic device. The electronic device may include a lens assembly, an image sensor including multiple unit pixels configured to convert the light passed through the lens assembly into an electrical signal, and a processor electrically connected to the image sensor to output an image based on the electrical signal. At least one unit pixel included in the multiple unit pixels includes a micro-lens and at least two subpixels formed to correspond to the micro-lens, and the processor is configured to acquire multiple electrical signals from the at least two subpixels, identify a ratio of the multiple electrical signals, and determine, based on the identified ratio, whether flare is generated due to refraction or reflection of the light.

16 Claims, 15 Drawing Sheets

(58) Field of Classification Search
CPC ...... H04N 23/687; H04N 23/81; H04N 23/84; H04N 25/61; H04N 25/704; G06T 5/80; H01L 27/146
See application file for complete search history.

(56) References Cited

U.S. PATENT DOCUMENTS

| | | |
|---|---|---|
| 2011/0025866 A1 | 2/2011 | Seo et al. |
| 2011/0310290 A1 | 12/2011 | Douchida |
| 2016/0269602 A1* | 9/2016 | Osborne ................ G03B 13/36 |
| 2017/0330348 A1 | 11/2017 | Park et al. |
| 2018/0081149 A1* | 3/2018 | Bae ........................ G02B 7/021 |
| 2020/0029035 A1 | 1/2020 | Agranov et al. |
| 2020/0186723 A1* | 6/2020 | Kang ...................... H04N 23/67 |
| 2021/0066375 A1* | 3/2021 | Kim ...................... G02B 3/0056 |
| 2022/0070376 A1 | 3/2022 | Lee et al. |
| 2022/0075161 A1 | 3/2022 | Im et al. |
| 2022/0091373 A1 | 3/2022 | Saiga et al. |
| 2022/0159188 A1* | 5/2022 | Lee ........................ H04N 23/63 |
| 2023/0042544 A1* | 2/2023 | Lee ...................... G06V 10/141 |
| 2023/0177709 A1 | 6/2023 | Lee et al. |

FOREIGN PATENT DOCUMENTS

| | | |
|---|---|---|
| JP | 2013055566 A | 3/2013 |
| KR | 10-2011-0099983 | 9/2011 |
| KR | 20170127638 A | 11/2017 |
| KR | 20200092165 A | 8/2020 |
| KR | 10-2021-0018249 | 2/2021 |
| KR | 10-2021-0128803 | 10/2021 |
| KR | 10-2022-0014495 | 2/2022 |
| KR | 10-2022-0029310 | 3/2022 |
| KR | 10-2022-0033399 | 3/2022 |
| KR | 20230026092 A | 2/2023 |
| WO | WO-2021210875 A1 * | 10/2021 ............. G06T 5/001 |

OTHER PUBLICATIONS

Written Opinion dated Sep. 1, 2023 in International Patent Application No. PCT/KR2023/007306.
Extended Search Report dated May 8, 2025 in European Patent Application 23812209.7.

* cited by examiner

ELECTRONIC DEVICE INCLUDING FOLDED CAMERA MODULE FOR FLARE COMPENSATION AND CONTROL METHOD THEREOF

CROSS-REFERENCE TO RELATED APPLICATIONS

This application is a continuation of International Application No. PCT/KR2023/007306 designating the United States, filed May 26, 2023, in the Korean Intellectual Property Receiving Office and claiming priority to Korean Patent Application No. 10-2022-0065178, filed May 27, 2022, in the Korean Intellectual Property Office and to Korean Patent Application No. 10-2022-0136864, filed Oct. 21, 2022, in the Korean Intellectual Property Office. The entire disclosures of each of these applications are incorporated herein by reference for all purposes.

BACKGROUND

Field

The disclosure relates to an electronic device including a camera module and a control method thereof.

Description of Related Art

As consumer's interest shift from compact cameras to camera modules embedded in a smartphone, an important issue in camera manufacturing is achieving miniaturization while maintaining image quality. A large optical system and a large imaging surface (image sensor) are advantageous in terms of image quality, and thus high image quality and miniaturization are in a trade-off relationship. In order to solve this problem, multiple single-focus lens type camera modules have been included in one electronic device.

Single-focus lens type modules are generally configured to have different focal lengths, and may be properly mixed and operated with digital zoom, thereby making a zoom effect. As for a camera, based on a 35 mm camera optical system and a 24-35 mm focal length (wide), a shorter focal length type and a longer focal length type are commonly applied. Among these, a telephoto (typically 3×) optical system with a relatively long focal length requires a longer mounting space in the longitudinal plane, and thus, in general, an optical system having a smaller size than a wide-angle optical system is adopted and mounted. However, since the market requires higher zoom performance, the difficulty of mounting a camera in a limited space is increasing. In order to solve this problem, a camera module with a refractive (or curved) optical system using reflection of a prism, which is more mountable, is being developed. A camera module to which a refractive optical system is applied may be made by reflecting and/or refracting incident light two or more times via a prism (or a mirror) and changing the incident path of light while maintaining an effective focal length of the light.

A camera module including such a refractive optical system may have a flare phenomenon in which light reflected along an unwanted optical path in the prism is imaged on an image sensor as it is.

The foregoing information may be provided as background technologies for helping understanding of the disclosure. No claim or determination is made as to whether any of the above description may be applied as prior art in relation to the disclosure.

SUMMARY

An embodiment of the disclosure may provide an electronic device. The electronic device may include a lens assembly, an image sensor including multiple unit pixels configured to image light having passed through the lens assembly and convert the imaged light into an electrical signal, and a processor electrically connected to the image sensor to output an image using the electrical signal, wherein at least one unit pixel included in the multiple unit pixels includes a micro lens and at least two subpixels formed to correspond to the micro lens. The processor may be configured to acquire multiple electrical signals from the at least two subpixels, identify a ratio of the multiple electrical signals, and determine, based on the identified ratio, whether flare is generated due to refraction or reflection of the light, and/or compensate the flare.

An embodiment of the disclosure may provide a method for controlling an electronic device. The electronic device may include a camera module including a lens assembly and an image sensor including multiple unit pixels, and a processor. The method of controlling the electronic device may be implemented by the processor and the processor may acquire multiple electrical signals from at least two subpixels included in each of the multiple unit pixels, based on a ratio of light incident through a first optical path in which light is reflected or refracted at least twice in the lens assembly and a second optical path different from the first optical path, identifying a ratio of the multiple electrical signals, and determining, based on the identified ratio, whether flare is caused by refraction or reflection of the light, and/or compensating the flare.

BRIEF DESCRIPTION OF THE DRAWINGS

The above and/or other aspects of the disclosure will be more apparent by describing certain embodiments of the disclosure with reference to the accompanying drawings, in which.

DETAILED DESCRIPTION

Figure 1:
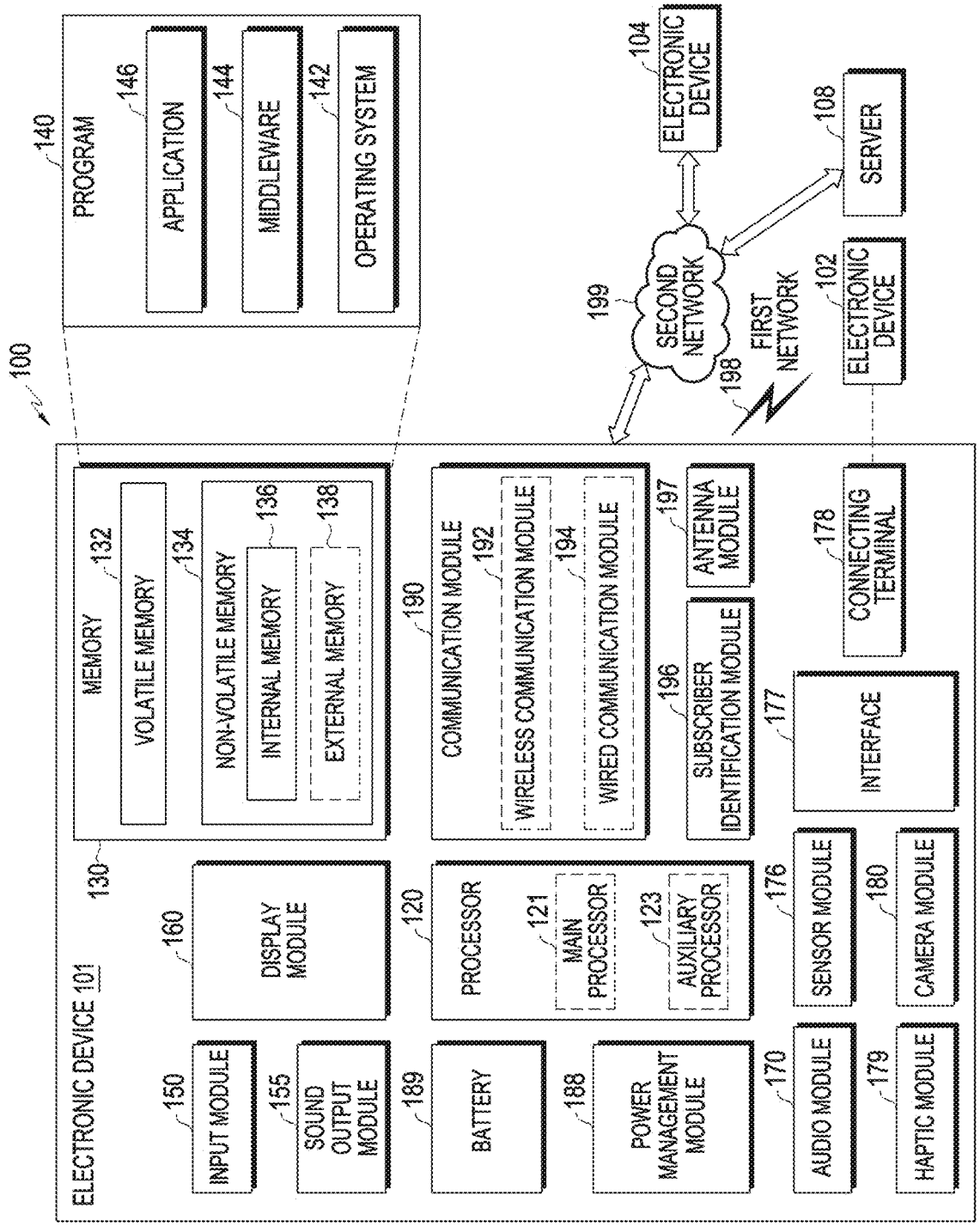
FIG. 1 is a block diagram of an electronic device in a network environment according to various embodiments.

A refractive optical system according to an embodiment may be formed to have a structure in which three prism pieces constitute a parallelogram prism structure with an acute angle of approximately 30 degrees and an optical lens is disposed on one surface having an acute angle in a lens lead type structure (a structure in which a lens on an optical path is disposed in front of a refractive optical system). Light is input through the optical lens and the optical path is reflected four times in the parallelogram prism structure. The optical path is terminated at an image sensor for imaging located on a rear surface having another acute angle. It is possible to effectively configure a long focusing distance by reflecting incident light four times in a relatively narrow instrument structure.

A refractive optical system according to an embodiment may be formed in a lens lead type, and may have a structure in which an approximately 45-degree triangular prism is disposed under an aperture lens, an operable and movable optical system such as auto focus (AF) is disposed on a refracted optical path, and another approximately 45-degree triangular prism is additionally disposed on the opposite side of a prism under an aperture, and an image sensor is mounted next to the aperture. In this embodiment, by reflecting incident light twice, a lens with a long focal length can be effectively mounted in a narrow space, and a space for movement of an AF structure can also be secured.

In such a multi-refraction lens, a flare phenomenon may occur due to differently formed optical paths. The flare phenomenon due to the optical paths being differently formed may refer, for example, to a phenomenon in which, in an optical system designed such that light is reflected light four times and then terminated at an image sensor, when light reflected twice is directed to an image sensor surface, an acquired image is blurred or output in the form of a double image by this light. Unlike a flare phenomenon due to the high brightness of a subject itself of a typical direct-type optical system without refraction, the flare phenomenon due to the optical paths being differently formed is a flare phenomenon that occurs along a predicted inner surface optical path, and may imply an artifact due to the adoption of a refractive optical system.

An embodiment of the disclosure provides an electronic device for preventing or reducing a flare phenomenon due to these optical paths being differently formed, and a method for controlling the same.

The technical features and advantages to be achieved herein are not limited to the features and advantages described above, and other features and advantages not described above will be clearly understood from the description below.

The following description of the accompanying drawings may provide understanding of various types of example implementations of the disclosure, including the claims and equivalents thereto. Although embodiments disclosed in the following description include various specific details to help understanding, these embodiments are considered to be one of the various exemplary embodiments. Accordingly, those skilled in the art will understand that various changes and modifications of various types of implementation described herein may be made without departing from the scope and technical spirit of the disclosure. Also, descriptions of well-known functions and configurations may be omitted for clarity and conciseness.

The terms and words used in the following description and claims are not limited to referenced meanings, and may be used to clearly and consistently describe an embodiment of the disclosure. Accordingly, it will be apparent to those skilled in the art that the following description of various types of example implementations of the disclosure is provided to describe, and not to limit, the scope of the disclosure and equivalents thereof.

It should be understood that the singular forms of "a", "an", and "the" include plural meanings, unless the context clearly dictates otherwise. Thus, for example, the wording "a constituent element surface" may be understood to include one or more of the surfaces of a constituent element.

FIG. 1 is a block diagram illustrating an electronic device 101 in a network environment 100 according to an embodiment of the disclosure. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one of the components (e.g., the connecting terminal 178) may be omitted from the electronic device 101, or one or more other components may be added in the electronic device 101. In an embodiment, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of, the main processor 121.

The auxiliary processor 123 may control, for example, at least some of functions or states related to at least one component (e.g., the display module 160, the sensor module 176, or the communication module 190) among the components of the electronic device 101, instead of the main processor 121, while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence model is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof, but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of, the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his/her tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of or including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more external devices of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and do not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Embodiments of the disclosure may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities, and some of the multiple entities may be separately disposed in different components. According to an embodiment, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

In the following detailed description, the longitudinal direction, width direction, and/or thickness direction of an electronic device may be described. The longitudinal direction may, for example, be defined as "Y-axis direction", the width direction may, for example, be defined as "X-axis direction", and/or the thickness direction may, for example, be defined as "Z-axis direction". In an embodiment, with respect to the direction in which a constituent element is directed, "negative/positive (−/+)" may be described together with the orthogonal coordinate system illustrated in the drawings. For example, the front surface of an electronic device or a housing may, for example, be defined as "the surface facing the +Z direction", and the rear surface may, for example, be defined as "the surface facing the −Z direction". In an embodiment, the side surface of the electronic device or the housing may include an area facing the +X direction, an area facing the +Y direction, an area facing the −X direction, and/or an area facing the −Y direction. In an embodiment, "the X-axis direction" may, for example, include both "the −X direction" and "the +X direction". This is based on the orthogonal coordinate system illustrated in the drawings for conciseness of description, and it is noted that descriptions of these directions or constituent elements do not limit the embodiment(s) of the disclosure.

Figure 2:
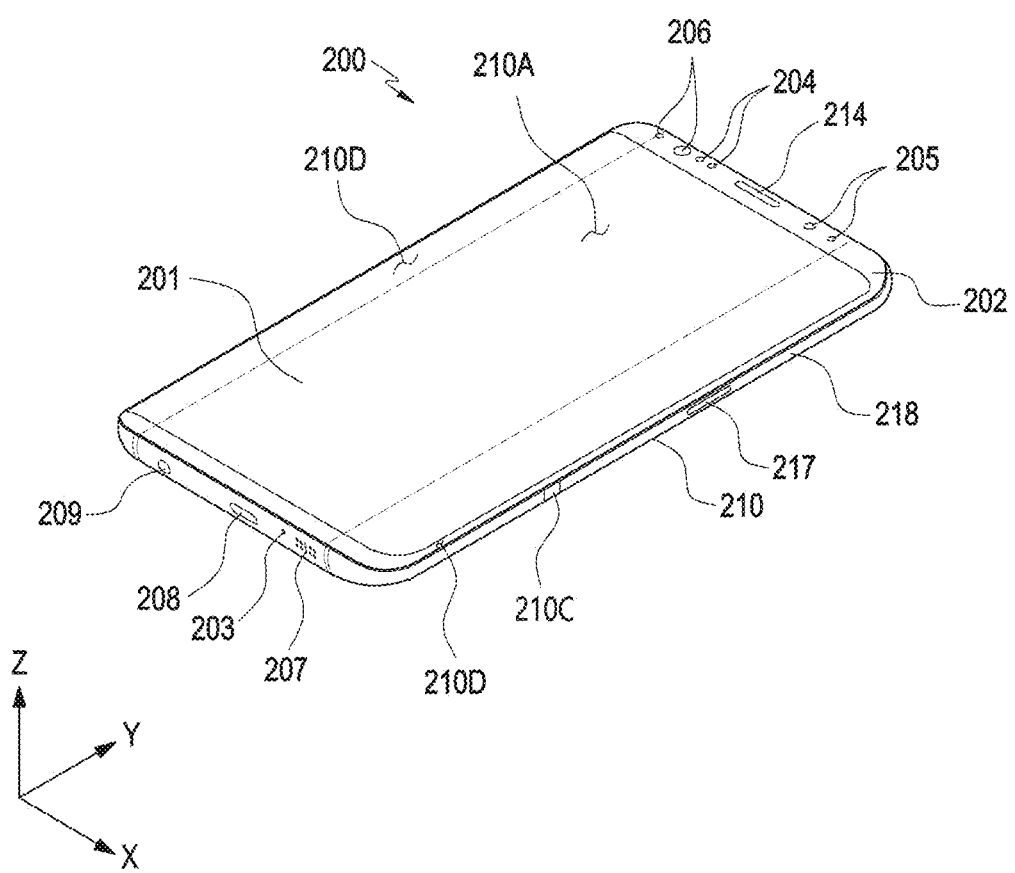
FIG. 2 is a front perspective view illustrating constituent elements of an electronic device according to various embodiments.
Figure 3:
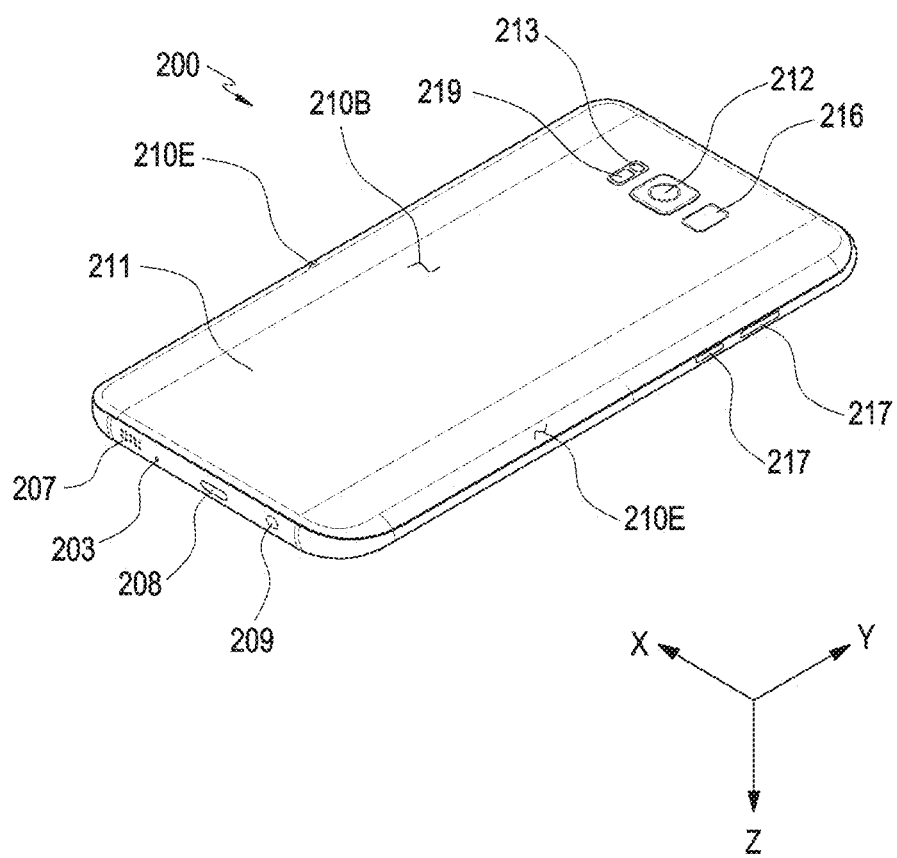
FIG. 3 is a rear perspective view of an electronic device according to various embodiments.

FIG. 2 is a perspective view illustrating the front surface an example electronic device 200 according to various embodiments. FIG. 3 is a perspective view illustrating the rear surface of the example electronic device 200 illustrated in FIG. 2 according to various embodiments.

Referring to FIGS. 2 and 3, the electronic device 200 according to an embodiment may include a housing 210 including a first surface (or a front surface) 210A, a second surface (or a rear surface) 210B, and a side surface 210C surrounding a space between the first surface 210A and the second surface 210B. In an embodiment (not shown), the housing may refer to a structure forming some of the first surface 210A, the second surface 210B, and the side surface 210C in FIG. 2. According to an embodiment, the first surface 210A may be formed by a front plate 202 (e.g., a polymer plate or a glass plate including various coated layers) having at least a part which is substantially transparent. The second surface 210B may be formed by a rear plate 211 which is substantially opaque. The rear plate 211 may be formed of, for example, coated or colored glass, ceramic, polymer, metal (e.g., aluminum, stainless steel (STS), or magnesium), or a combination of at least two of the above materials. The side surface 210C may be coupled to the front plate 202 and the rear plate 211 and may be formed by a lateral structure (or a "lateral bezel structure") 218 including metal and/or polymer. In an embodiment, the rear plate 211 and the lateral structure 218 may be integrally formed and may include the same material (e.g., a metal material such as aluminum).

In the illustrated embodiment, the front plate 202 may include two first areas 210D, which are curved and seamlessly extended from the first surface 210A toward the rear plate 211, at both ends of a long edge of the front plate 202. In the illustrated embodiment (see FIG. 3), the rear plate 211 may include two second areas 210E, which are curved and seamlessly extended from the second surface 210B toward the front plate 202, at both ends of a long edge. In an embodiment, the front plate 202 (or the rear plate 211) may include only one of the first areas 210D (or the second areas 210E). In an embodiment, some of the first areas 210D or the second areas 210E may not be included. In the above embodiments, when viewed from the side surface of the electronic device 200, the lateral structure 218 may have a first thickness (or width) at a side surface that does not include the first areas 210D or the second areas 210E as described above, and may have a second thickness smaller than the first thickness at a side surface including the first areas 210D or the second areas 210E.

According to an embodiment, the electronic device 200 may include at least one among a display 201, audio modules 203, 207, and 214, sensor modules 204, 216, and 219, camera modules 205, 212, and 213, key input devices 217, a light-emitting element 206, and connector holes 208 and 209. In an embodiment, in the electronic device 200, at least one (e.g., the key input devices 217 or the light-emitting element 206) of the constituent elements may be omitted, or other constituent elements may be additionally included.

The display 201 may be visually exposed through, for example, a significant portion of the front plate 202. In an embodiment, at least a portion of the display 201 may be visually exposed through the front plate 202 forming the first surface 210A and the first areas 210D of the side surface 210C. In an embodiment, corners of the display 201 may be shaped to be substantially identical to the shape of outer edge of the front plate 202 adjacent thereto. In an embodiment (not shown), in order to enlarge an area in which the display 201 is visually exposed, the distance between the outer edge of the display 201 and the outer edge of the front plate 202 may be formed to be substantially uniform.

In an embodiment (not shown), recesses or openings may be formed in a part of a screen display area of the display 201, and at least one among the audio module 214, the sensor module 204, the camera module 205, and the light-emitting element 206 aligned with the recesses or the openings may be included. In an embodiment (not shown), the rear surface of the screen display area of the display 201 may include at least one among the audio module 214, the sensor module 204, the camera module 205, a fingerprint sensor 216, and the light-emitting element 206. In an embodiment (not shown), the display 201 may be combined with or disposed adjacent to a touch sensing circuit, a pressure sensor capable of measuring the strength (pressure) of a touch, and/or a digitizer for detecting a magnetic stylus pen. In an embodiment, at least some of the sensor modules 204 and 219 and/or at least some of the key input devices 217 may be disposed in the first areas 210D and/or the second areas 210E.

The audio modules 203, 207, and 214 may include a microphone hole 203 and speaker holes 207 and 214. In the microphone hole 203, a microphone for acquiring external sound may be disposed, and in an embodiment, multiple microphones may be disposed to detect the direction of sound. The speaker holes 207 and 214 may include an external speaker hole 207 and a receiver hole 214 for communication. In an embodiment, the speaker holes 207 and 214 and the microphone hole 203 may be implemented as a single hole, or a speaker may be included without the speaker holes 207 and 214 (e.g., a piezo speaker).

The sensor modules 204, 216, and 219 may generate electrical signals or data values corresponding to an internal operation state of the electronic device 200 or an external environmental state. The sensor modules 204, 216, and 219 may include, for example, a first sensor module 204 (e.g., a proximity sensor) and/or a second sensor module (not shown) (e.g., a fingerprint sensor) disposed on the first surface 210A of the housing 210, and/or a third sensor module 219 (e.g., a Heart Rate Monitor (HRM) sensor) and/or a fourth sensor module 216 (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include the sensor module 176 in FIG. 1, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illumination sensor.

The camera modules 205, 212, and 213 may include a first camera device 205 disposed in the first surface 210A of the electronic device 200, and a second camera device 212 and/or a flash 213 disposed on the second surface 210B. The camera devices 205 and 212 each may include one or multiple lenses, an image sensor, and/or an image signal processor. The flash 213 may include, for example, a light-emitting diode or a xenon lamp. In an embodiment, two or more lenses (infrared camera, wide-angle, and telephoto lenses) and image sensors may be disposed on one surface of the electronic device 200.

The key input devices 217 may be disposed on the side surface 210C of the housing 210. In an embodiment, the electronic device 200 may not include some or all of the above-mentioned key input devices 217, and the key input devices 217 that are not included may be implemented in other forms such as soft keys on the display 201. In an embodiment, the key input devices may include the sensor module 216 disposed on the second surface 210B of the housing 210.

The light-emitting element 206 may be disposed on the first surface 210A of the housing 210, for example. The light-emitting element 206 may provide, for example, state information of the electronic device 200 in the form of light. In an embodiment, the light-emitting element 206 may provide, for example, a light source interoperating with the operation of the camera module 205. The light-emitting element 206 may include, for example, an LED, an IR LED, and a xenon lamp.

The connector holes 208 and 209 may include a first connector hole 208 capable of accommodating a connector (e.g., a USB connector) for transmitting and receiving power and/or data to and from an external electronic device, and/or a second connector hole (e.g., an earphone jack) 209 capable of accommodating a connector for transmitting and receiving audio signals to and from an external electronic device.

Figure 4:
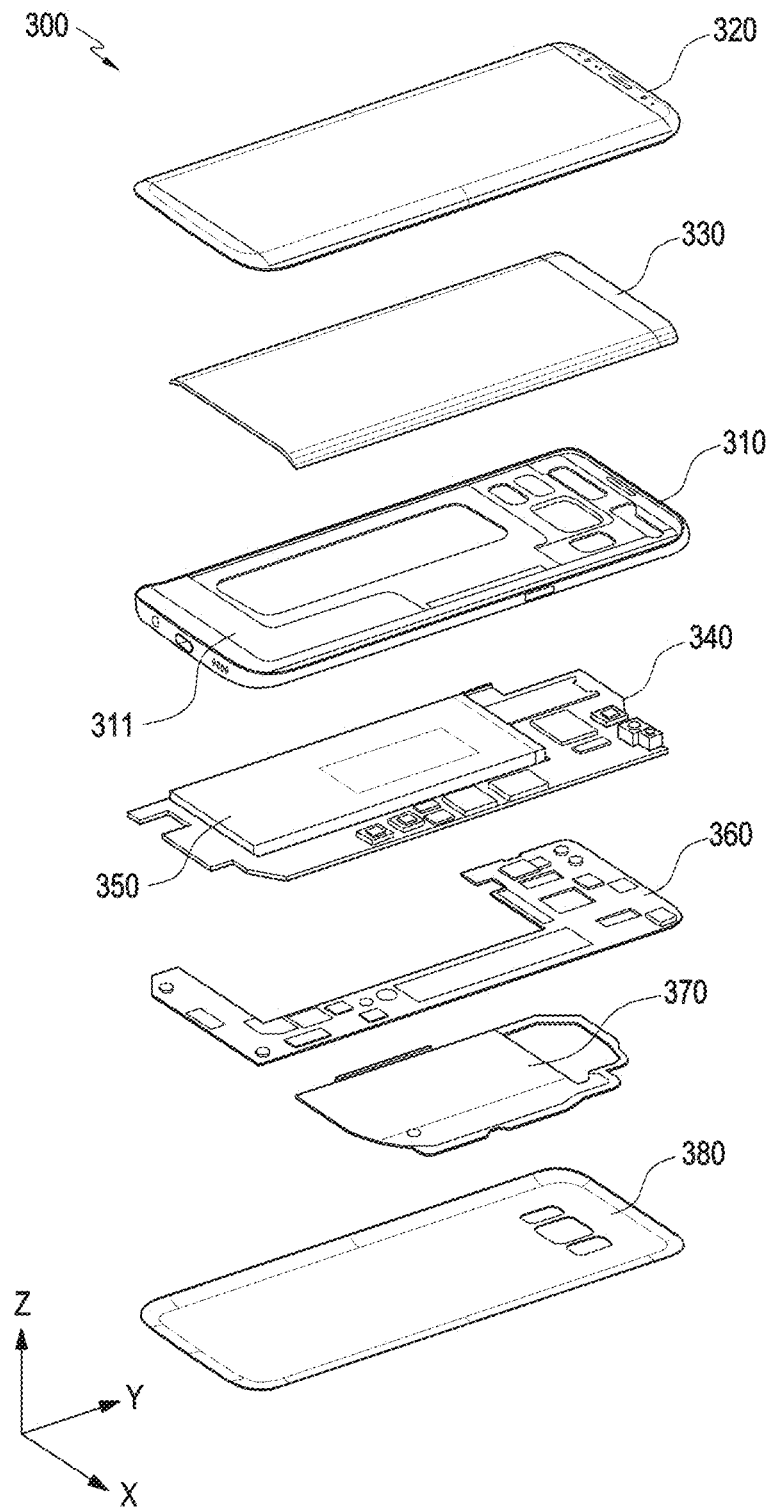
FIG. 4 is an exploded perspective view of an electronic device according to an embodiment.

FIG. 4 is an exploded perspective view of the electronic device 200 illustrated in FIG. 2 according to an embodiment.

Referring to FIG. 4, an electronic device 300 (e.g., the electronic device 200 in FIG. 2 or 3) may include a lateral structure 310 (e.g., the lateral structure 218 in FIG. 2), a first support member 311 (e.g., a bracket), a front plate 320 (e.g., the front plate 202 in FIG. 2), a display 330 (e.g., the display 201 in FIG. 2), a printed circuit board 340 (e.g., a printed circuit board (PCB), a printed board assembly (PBA), a flexible PCB (FPCB), or a rigid-flexible PCB (RFPCB)), a battery 350, a second support member 360 (e.g., a rear case), an antenna 370, and a rear plate 380 (e.g., the rear plate 211 in FIG. 3). In an embodiment, in the electronic device 300, at least one (e.g., the first support member 311 or the second support member 360) of the constituent elements may be omitted, or other constituent elements may be additionally included. At least one of the constituent elements of the electronic device 300 may be identical or similar to at least one of the constituent elements of the electronic device 200 in FIG. 2 or 3, and redundant descriptions thereof will may not be repeated.

The first support member 311 may be disposed in the electronic device 300 and connected to the lateral structure 310, or may be formed integrally with the lateral structure 310. The first support member 311 may be formed of, for example, a metal material and/or a non-metal (e.g., polymer) material. The first support member 311 may have one surface coupled to the display 330 and the other surface coupled to the printed circuit board 340. A processor, a memory, and/or an interface may be mounted on the printed circuit board 340. The processor may include, for example, at least one of a central processing unit, an application processor, a graphics processing unit, an image signal processor, a sensor hub processor, or a communication processor.

The memory may include, for example, volatile memory or non-volatile memory.

The interface may include, for example, a high-definition multimedia interface (HDMI), a universal serial bus (USB) interface, an SD card interface, and/or an audio interface. The interface may electrically or physically connect the electronic device 300 to an external electronic device, and may include a USB connector, an SD card/MMC connector, or an audio connector.

The battery 350 is a device for supplying power to at least one constituent element of the electronic device 300, and may include, for example, a non-rechargeable primary battery, a rechargeable secondary battery, or a fuel cell. At least a portion of the battery 350 may be disposed substantially on the same plane as the printed circuit board 340, for example. The battery 350 may be integrally disposed in the electronic device 300, or may be disposed detachably from the electronic device 300.

The antenna 370 may be disposed between the rear plate 380 and the battery 350. The antenna 370 may include, for example, a near-field communication (NFC) antenna, a wireless charging antenna, and/or a magnetic secure transmission (MST) antenna. The antenna 370 may, for example, perform short-range communication with an external device or wirelessly transmit/receive power required for charging to/from the external device. In an embodiment, an antenna structure may be formed by a part of the lateral structure 310 and/or the first support member 311 or a combination thereof. In the detailed description below, reference may be made to the electronic devices 101, 102, 104, 200, and 300 of the preceding embodiments, and it is noted that in the drawings, the same reference numeral is assigned to an element that can be easily understood through the preceding embodiments, or omitted, and that the detailed description may also be omitted.

Figure 5:
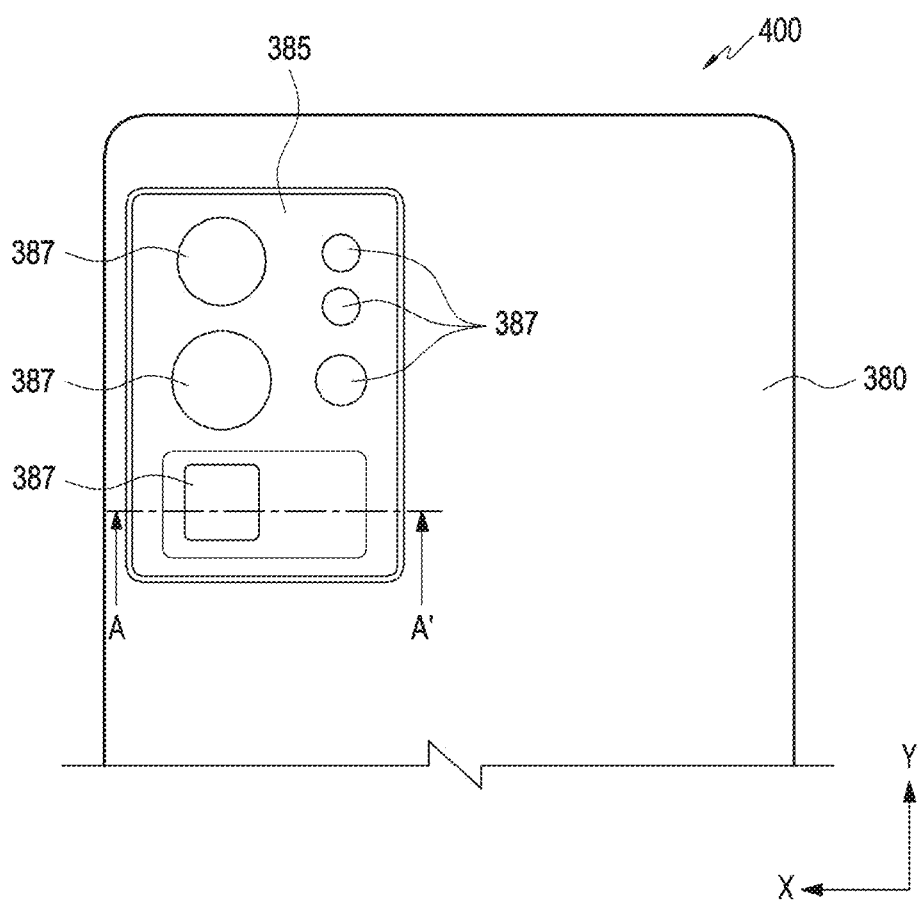
FIG. 5 illustrates an electronic device including a camera module according to an embodiment.
Figure 6:
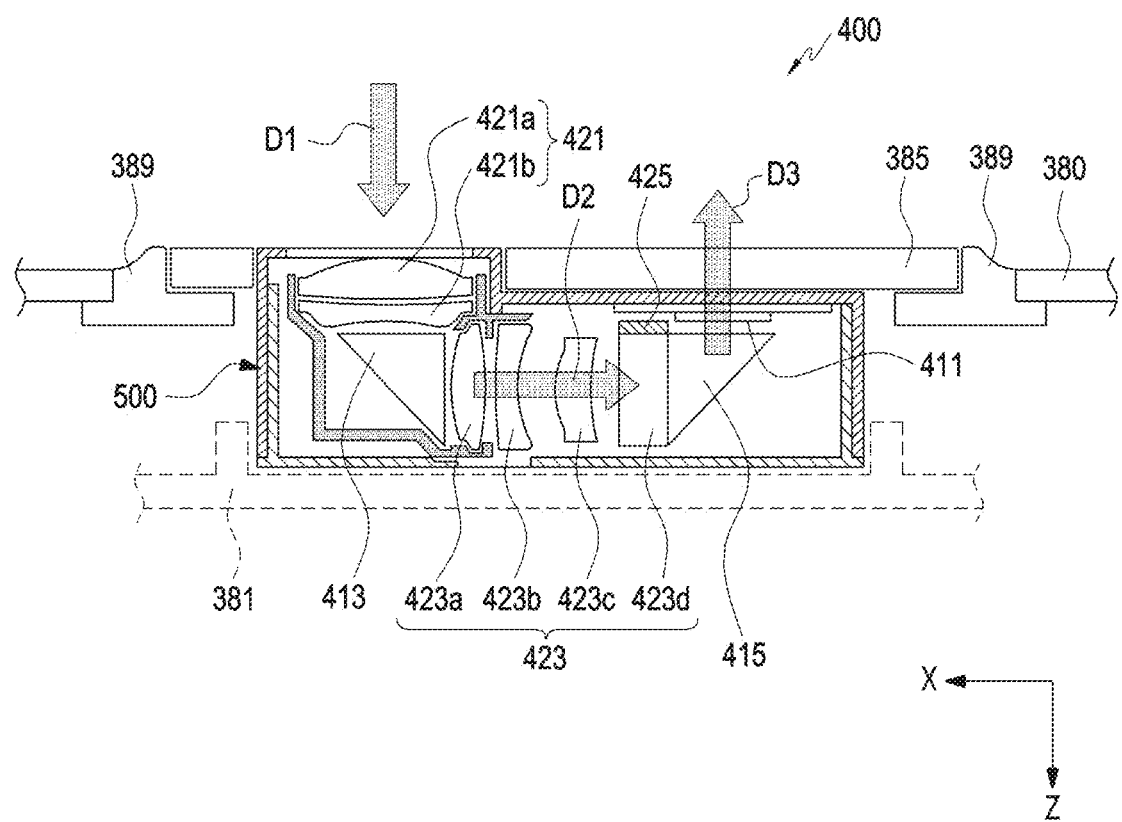
FIG. 6 illustrates a camera module including a curved optical system according to an embodiment.
Figure 7:
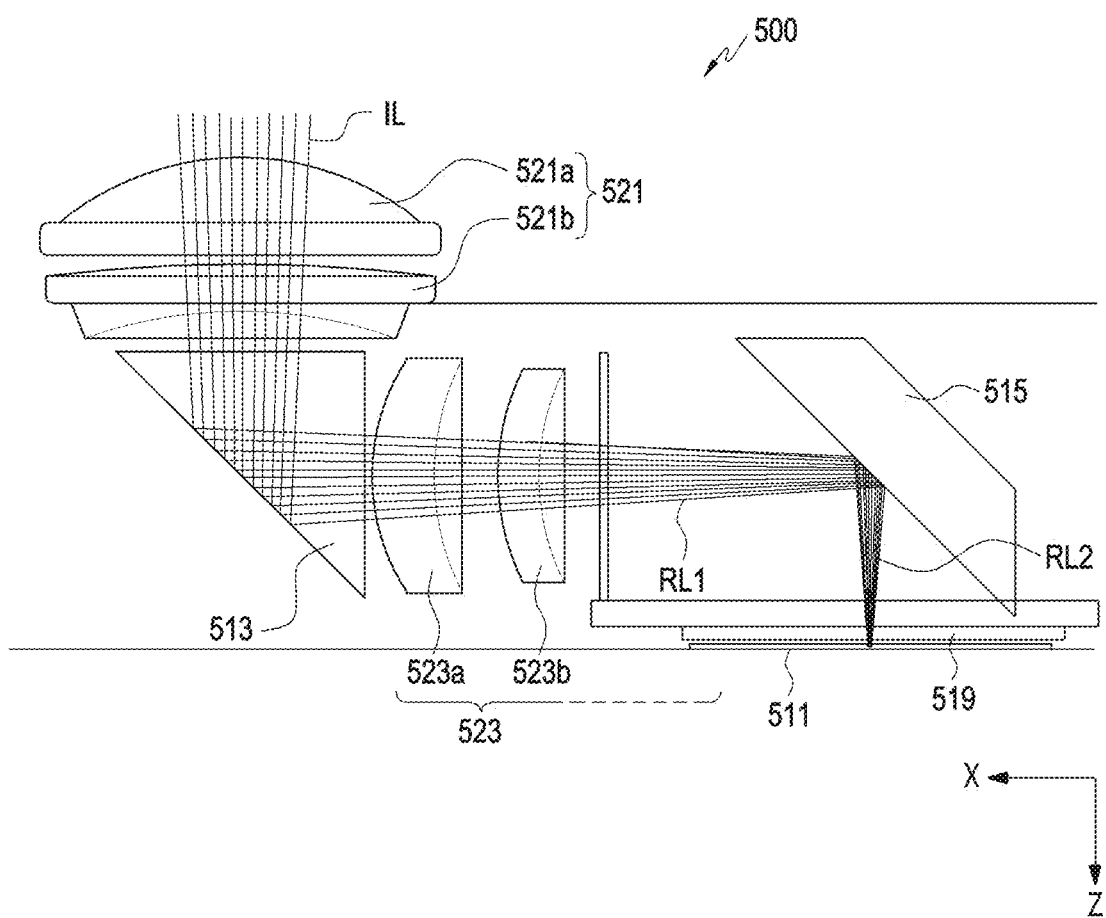
FIG. 7 illustrates a camera module including a curved optical system according to an embodiment.

FIG. 5 is a plan view illustrating the rear surface of an electronic device 400 (e.g., the electronic devices 101, 102, 104, 200, and 300 in FIGS. 1, 2, 3, and 4) according to an embodiment of the disclosure. FIG. 6 is a cross-sectional view of a portion of the electronic device 400 according to an embodiment of the disclosure, taken along line AA' in FIG. 5. FIG. 7 is a configuration diagram illustrating an optical path of a lens assembly 500 in the electronic device 400 according to an embodiment of the disclosure.

Referring to FIGS. 5 and 6, the electronic device 400 according to an embodiment of the disclosure may include a camera window 385 disposed on one surface (e.g., the second surface 210B in FIG. 3). In an embodiment, the camera window 385 may be a portion of the rear plate 380. In an embodiment, the camera window 385 may be coupled to the rear plate 380 through a decorative member 389, and, when viewed from the outside, the decorative member 389 may be exposed in the form of surrounding the camera window 385. According to an embodiment, the camera window 385 may include multiple transparent areas 387, and the electronic device 400 may receive external light or transmit light to the outside through at least one of the transparent areas 387. For example, the electronic device 400 may include at least one lens assembly 500 (e.g., the camera modules 180, 205, 212, and 213 in FIGS. 1, 2, and 3) disposed to correspond to at least some of the transparent areas 387, a lighting module, and at least one light source (e.g., an infrared light source) disposed to correspond to others of the transparent areas 387. In an embodiment, through any one of the transparent areas 387, the lens assembly 500 or the light source may receive external light or may emit light to the outside of the electronic device 400. In an embodiment, the electronic device 400 or the lens assembly 500 may further include a camera support member 381. The camera support member 381 may position or fix at least one of the lens assembly 500 or another lens assembly (e.g., a wide-angle camera, an ultra-wide-angle camera, or a macro camera) adjacent thereto to the inside of the rear plate 380 or the camera window 385. In an embodiment, the camera support member 381 may be substantially a portion of the first support member 311 or the second support member 360 in FIG. 4.

According to an embodiment, the electronic device 400 may include the lens assembly 500 or at least one of a wide-angle camera, an ultra-wide-angle camera, a macro camera, a telephoto camera, or an infrared photodiode as a light-receiving device, and may include a flash (e.g., the flash 213 in FIG. 3) or an infrared laser diode as a light source or a light-emitting element. In an embodiment, the electronic device 400 may emit an infrared laser toward a subject using an infrared laser diode and an infrared photodiode, and may receive the infrared laser reflected by the subject to detect the distance or depth to the subject. In an embodiment, the electronic device 400 may photograph a subject using any one or a combination of at least two cameras, and may provide illumination toward the subject using a flash as necessary.

According to an embodiment, a wide-angle camera, an ultra-wide-angle camera, or a macro camera among cameras has a shorter total track length along the optical axis direction of the lens(es) when compared with a telephoto camera (e.g., the lens assembly 500). For example, in a telephoto camera (e.g., the lens assembly 500) having a relatively long focal length, the total track length of the lens(es) 421a, 421b, 423a, 423b, and 423c or 521a, 521b, 523a, and 523b is greater than that of other cameras. The "total track length" of the lens(es) may refer to, for example, the distance from a subject-side surface of a lens closest to a subject to the imaging surface of an image sensor 411. As in the embodiment to be described later (e.g., the lens assembly 600 in FIG. 8), when other optical member(s) (e.g., mirror or prism) is disposed between the lens(es) and the image sensor, the "total track length" of the lens(es) may refer to, for example, the distance from the subject-side surface of a lens closest to a subject to the sensor-side surface of a lens closest to the image sensor. In an embodiment, in the case of a wide-angle camera, an ultra-wide-angle camera, or a macro camera, even when lens(es) are arranged along the direction of thickness (e.g., the thickness measured in the Z-axis direction in FIG. 4 or 6) of the electronic device 400, a substantial effect of the arrangement on the thickness of the electronic device 400 may be small. For example, a wide-angle camera, an ultra-wide-angle camera, or a macro camera may be disposed in the electronic device 400 in a state in which a direction in which light is incident on the electronic device 400 from the outside is substantially identical to the optical axis direction of lens(es). This wide-angle camera, ultra-wide-angle camera, or macro camera may be referred to as a direct-type optical system. In an embodiment, when compared with a wide-angle camera, an ultra-wide camera, or a macro camera, the lens assembly 500 (e.g., a telephoto camera) has a small angle of view, but may be useful for photographing a subject at a greater distance and may include more lenses 421a, 421b, 423a, 423b, and 423c or 521a, 521b, 523a, and 523b. For example, when the lens(es) 423a, 423b, and 423c or 521a, 521b, 523a, and 523b of the lens assembly 500 are arranged in the thickness direction (e.g., the Z-axis direction) of the electronic device 400, the thickness of the electronic device 400 may increase, or the lens assembly 500 may protrude to a significant extent outside the electronic device 400. In an embodiment of the disclosure, the lens assembly 500 may include at least one reflective and/or refractive member (including, e.g., reflector and/or refractor) 413 or 415, or 513 or 515 that reflects or refracts incident light IL in a different direction. In implementing a telephoto function, the lenses 423a, 423b, and 423c or 521a, 521b, 523a, and 523b may be arranged to be movable forward and backward in the incident direction of light or in the traveling direction of reflected or refracted light, and thus the thickness of the electronic device 400 may be prevented from increasing or may be reduced.

Referring to FIGS. 6 and 7, the lens assembly 500 may include a first reflective and/or refractive member 413 or 513, a second reflective and/or refractive member 415 or 515, an image sensor 411 or 511, and/or at least one lens system (e.g., a second lens group 423 or 523 including second lenses 423a, 423b, and 423c or 523a and 523b or a dummy member 423d).

The lens assembly 500 in FIGS. 6 and 7 is a lens assembly in which the traveling direction of light can be bent at least twice, and a camera including the lens assembly 500 may be referred to, for example, as a "folded camera", and an optical system formed by such a camera may be referred to, for example, as a "refractive optical system". In the folded camera, the lens assembly 500 may include at least one lens system (e.g., the second lens group 423 or 523 including the second lenses 423a, 423b, and 423c or 523a and 523b or the dummy member 423d) so as to bend the traveling direction of light at least twice. In addition, in an embodiment of the at least one lens system, at least one optical member may guide or focus light RL1 reflected or refracted by the first reflective and/or refractive member 413 or 513 onto the second reflective and/or refractive member 415 or 515, and may prevent the light RL1 reflected or refracted by the first reflective and/or refractive member 413 or 513 from being directly incident onto the image sensor 411 or 511.

According to an embodiment, the first reflective and/or refractive member 413 or 513 may include, for example, at least one prism, and/or at least one mirror. For example, the first reflective and/or refractive member 413 or 513 may be formed as a prism and/or a combination of a plurality of prisms. For example, the first reflective and/or refractive member 413 or 513 may be formed as a mirror and/or a combination of a plurality of mirrors. For example, the first reflective and/or refractive member 413 or 513 may be formed as a prism including at least one mirror. For example, at least one surface of the first reflective and/or refractive member 413 or 513 may be formed as a prism including a mirror. The first reflective and/or refractive member 413 or 513 may reflect or refract light IL, incident in a first direction D1, in a second direction D2 crossing the first direction D1. The first direction D1 may be, for example, a direction in which the light IL is incident from the outside to the electronic device 400 or the lens assembly 500 through one of the transparent areas 387 in FIG. 5 when photographing a subject. In an embodiment, the first direction D1 may refer to, for example, a photographing direction, a subject direction, an oriented direction of the lens assembly 500, or a direction parallel thereto. In an embodiment, the first direction D1 may be parallel to the Z-axis direction or the thickness direction of the electronic device 400.

According to an embodiment, the second reflective and/or refractive member 415 or 515 may include, for example, at least one prism, and/or at least one mirror. For example, the second reflective and/or refractive member 413 or 513 may be formed as a prism and/or a combination of a plurality of prisms. For example, the second reflective and/or refractive member 413 or 513 may be formed as a mirror and/or a combination of a plurality of mirrors. For example, the second reflective and/or refractive member 415 or 515 may be formed as a prism including at least one mirror. For example, at least one surface of the second reflective and/or refractive member 415 or 515 may be formed as a prism including a mirror. The second reflective and/or refractive member 415 or 515 may reflect or refract light RL1, reflected or refracted by the first reflective and/or refractive member 413 and 513 and incident along the second direction D2, in a third direction D3 crossing the second direction D2. In an embodiment, the third direction D3 may be substantially perpendicular to the second direction D2. For example, the third direction D3 may refer to, for example, a direction parallel to the Z-axis direction. However, an embodiment of the disclosure is not limited thereto, and the third direction D3 may refer to, for example, a direction inclined with respect to the second direction D2 or the X-Y plane according to the arrangement and specifications of the lens assembly 500 or the second reflective and/or refractive member 415 in the electronic device 400. In an embodiment, the third direction D3 may be substantially parallel to the first direction D1. Also, referring to FIG. 6, the third direction D3 may be toward the outside of the electronic device so as to correspond to the image sensor 411 disposed adjacent to the camera window 385. However, the third direction D3 of the disclosure is not limited thereto, and, as illustrated in FIG. 7, may be toward the inside of an electronic device so as to correspond to the image sensor 511 disposed in the inside (e.g., the camera support member 381 in FIG. 6) of the electronic device.

According to an example embodiment, the image sensor 411 or 511 may be configured to detect light RL2 that is reflected or refracted by the second reflective and/or refractive member 415 or 515 and is incident in the third direction D3. For example, light IL incident from the outside may be detected by the image sensor 411 or 511 via the first reflective and/or refractive member 413 or 513 and the second reflective and/or refractive member 415 or 515, and the electronic device 400 or the lens assembly 500 may acquire a subject image based on a signal or information detected through the image sensor 411 or 511. In an embodiment, the image sensor 411 or 511 may be disposed substantially parallel to the X-Y plane. For example, when the lens assembly 500 has an image stabilization function of shifting the image sensor 411 or 511, the image sensor 411 or 511 may move horizontally on a plane perpendicular to the first direction D1 or the third direction D3.

According to an embodiment, in performing the image stabilization operation, the image sensor 411 or 511 may be shifted in the longitudinal direction (e.g., the Y-axis direction) or the width direction (e.g., the X-axis direction) of the electronic device 400. For example, the image sensor 411 or 511 may be disposed on a plane perpendicular to the first direction D1 or the third direction D3, so that, in an electronic device having a small thickness (e.g., approximately 10 mm or less), it may be easy to expand the size of the image sensor 411 or 511 and/or to secure a space for an image stabilization operation. In an embodiment, when the lens assembly 500 is used as a telephoto camera, the quality of a captured image may be further improved by installation of an image stabilization function. In an embodiment, when the size of the image sensor 411 or 511 increases, performance of the lens assembly 500 may further increase.

According to an embodiment, the lens assembly 500 may further include a lens system (e.g., a first lens group 421 or 521 including at least one first lens 421a, 421b, 521a, or 521b) that guides or focuses the light IL incident in the first direction D1 onto the first reflective and/or refractive member 413 or 513. In an embodiment, the first lens group 421 or 521, or the first lens (e.g., the first lens 421a or 521a) disposed on the subject side in the lens assembly 500 may have positive refractive power. For example, the first lens 421a or 521a may be configured to focus or align the light IL incident from the outside on or with the first reflective and/or refractive member 413 or 513, so that an optical system ranging from the first lens 421a or 521a to the image sensor 411 or 511 may be miniaturized. When the lens assembly 500 includes the first lens group 421 or 521, a camera including the lens assembly may be referred to, for example, as a "lens lead-type camera". According to embodiments, the first lens group 421 or 521 may further include additional first lens(es) 421b or 521b in order to focus or align light incident from the outside.

According to an embodiment, the second lens group 423 or 523 may include a dummy member 423d and a light blocking member 425. For example, the dummy member 423d may be disposed inside the lens assembly 500 or the electronic device 400, may have a cylindrical shape extending in the second direction D2, and may allow the light RL1 traveling along the second direction D2 to pass therethrough. In an embodiment, the dummy member 423d may be, for example, one of lenses having positive or negative refractive power. In an embodiment, the dummy member 423d may be a component formed integrally with any one of the second lenses 423a, 423b, and 423c or 523a and 523b or the second reflective and/or refractive member 415 or 515.

According to an embodiment, the light blocking member 425 may be formed or disposed on at least a portion of the outer circumferential surface of the dummy member 423d, and may absorb, scatter, or reflect light. The light blocking member 425 may be formed by, for example, etching, black lacquering, and/or printing or depositing a reflective layer on at least a portion of the outer circumferential surface of the dummy member 423d. In an embodiment, a part of light reflected or refracted by the first reflective and/or refractive member 413 or 513 may be absorbed, scattered, or reflected by the light blocking member 425. In an embodiment, the light blocking member 425 may substantially prevent light reflected or refracted by the first reflective and/or refractive member 413 or 513 from being directly incident on the image sensor 411 or 511 without passing through the second lens group 423 or 523 and/or the second reflective and/or refractive member 415 or 515. For example, in the lens assembly 500, light sequentially traveling in the first direction D1, the second direction D2, and/or the third direction D3 (e.g., light following paths indicated by "IL", "RL1", and "RL2" in FIG. 7) may be incident on the image sensor 511, and light having traveled along another path may be substantially prevented from being incident on the image sensor 511.

According to an embodiment, at least one of the second lenses 423a, 423b, and 423c or 523a and 523b may move forward and backward between the first reflective and/or refractive member 413 or 513 and the second reflective and/or refractive member 415 or 515 along an axis having a direction substantially identical to the second direction D2. For example, the electronic device 400 (e.g., the processor 120 in FIG. 1) or the lens assembly 500 may perform focal length adjustment or focus adjustment by moving at least one second lens 423a, 423b, or 423c or 523a or 523b forward and backward along an axis having a direction substantially identical to the second direction (D2). A miniaturized electronic device such as a smartphone may have a thickness of about 10 mm, and in this case, the range in which the lens can move forward and backward in the thickness direction may be limited.

According to an embodiment, the second direction D2 may, for example, be substantially parallel to the longitudinal direction (e.g., the Y-axis direction in FIG. 4), the width direction (e.g., the X-axis direction in FIG. 4), and/or the X-Y plane, and, when compared to a typical wide-angle camera that moves forward and backward in the Z-axis direction for focus adjustment, a range in which the at least one second lens 423a, 423b, or 423c or 523a or 523b can move forward and backward may be large. For example, as the at least one second lens 423a, 423b, or 423c or 523a or 523b moves forward and backward along an axis having a substantially direction identical to the second direction D2, telephoto performance is improved in the lens assembly 500, and the degree of design freedom may be improved in securing a forward and backward movement space for focal length adjustment or focus adjustment.

According to an embodiment, the electronic device 400 and/or the lens assembly 500 may further include an infrared blocking filter 519. In an embodiment, the infrared blocking filter 519 may block light of an infrared or near-infrared wavelength band from being incident onto the image sensor 411 or 511, and may be disposed at an arbitrary position in an optical path between the first lens 421a or 521a and the image sensor 411 or 511. In an embodiment, the infrared cut filter 519 may be disposed at a position close to the image sensor 411 or 511 (e.g., between the image sensor 411 or 511 and the second reflective and/or refractive member 415 or 515), thereby restraining or preventing the infrared blocking filter 519 from being visually exposed to the outside. In an embodiment, the first reflective and/or refractive member 413 or 513, the second reflective and/or refractive member 415 or 515, and/or at least one optical member (e.g., the second lens group 423 or 523) may include an infrared blocking coating layer, and in this case, the infrared blocking filter 519 may be omitted. In an embodiment, the infrared blocking coating layer may be provided to at least one of an image sensor-side surface and a subject-side surface of the dummy member 423*d* or to the second reflective and/or refractive member 415 or 515. Accordingly, the image sensor 411 or 511 may detect light that has substantially passed through the infrared blocking filter 519 (or the infrared blocking coating layer).

Figure 8:
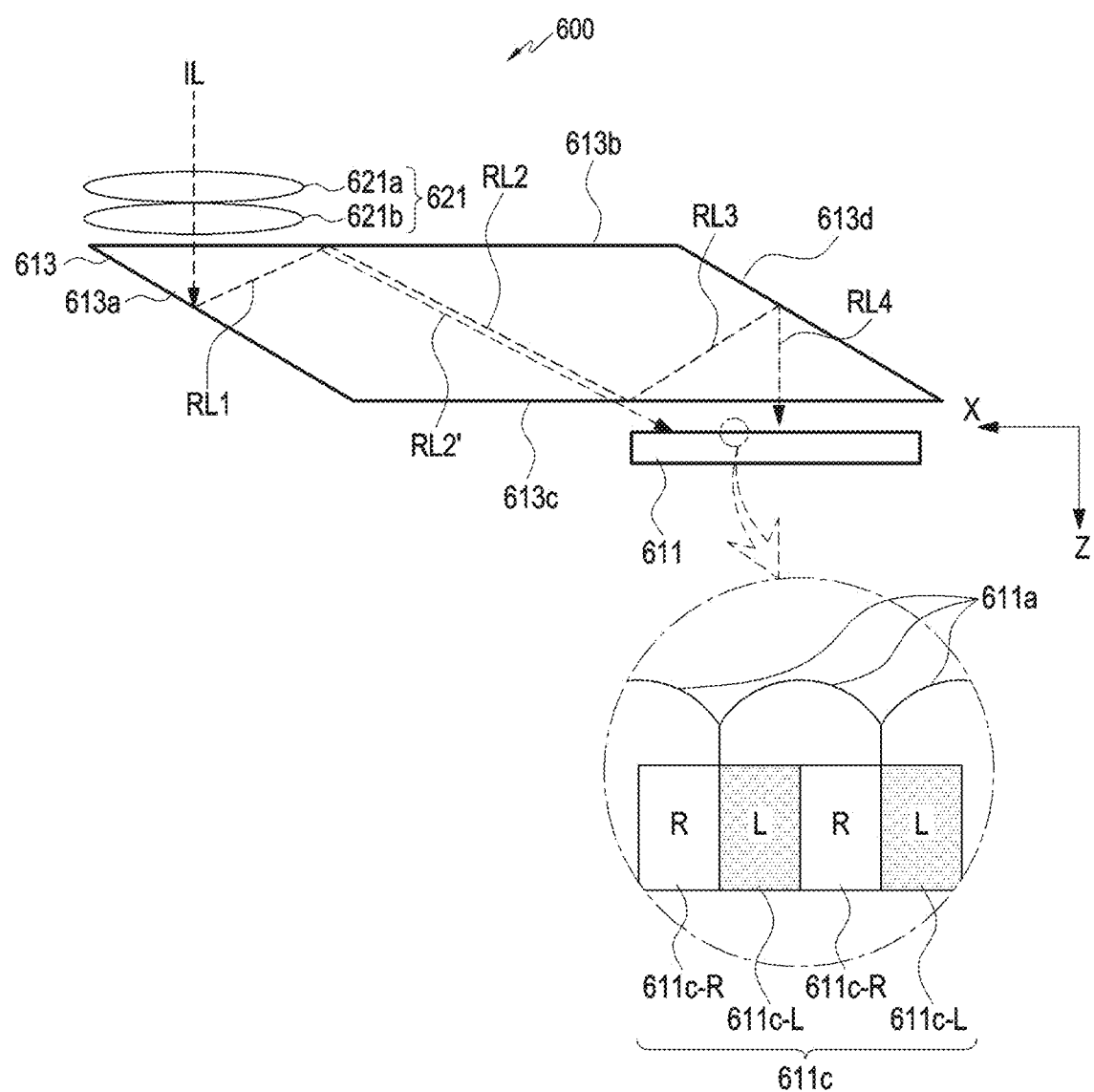
FIG. 8 conceptually illustrates a camera module including a curved optical system according to an embodiment.

FIG. 8 is a configuration diagram illustrating an optical path of a lens assembly 600 in the electronic device 400 according to an embodiment of the disclosure.

The lens assembly 600 may form a first optical path by refracting or reflecting light at least twice. Referring to FIG. 8, the first optical path may be indicated by a dotted line, and light traveling along the first optical path may follow paths indicated by "IL", "RL1", "RL2", "RL3", and "RL4" in FIG. 8. According to an embodiment, the first optical path may be an optical path that passes through the center of the lens assembly 600 and is substantially perpendicularly incident on an image sensor 611. The first optical path may be formed by at least one reflective and/or refractive member included in the lens assembly 600 and at least one lens that may be additionally provided to the at least one reflective and/or refractive member according to embodiments. For example, the lens assembly 600 may include one reflective and/or refractive member 613. In this case, the reflective and/or refractive member 613 may be formed in, for example, a trapezoidal prism or mirror structure. When the reflective and/or refractive member 613 is formed in a parallel trapezoidal prism or mirror structure, the reflective and/or refractive member 613 may include, for example, a first reflective surface 613*a*, a second reflective surface 613*b*, a third reflective surface 613*c*, and a fourth reflective surface 613*d*. In the embodiment in FIG. 8, the first reflective surface 613*a* and the fourth reflective surface 613*d* may be parallel to each other, and the second reflective surface 613*b* and the third reflective surface 613*c* may be parallel to each other, so that an optical path similar to that of the embodiment in FIG. 7 may be formed. In other words, in the embodiment in FIG. 8, the reflective and/or refractive member 613 may form a parallelogram prism or mirror structure. However, examples of the lens assembly 600 of the disclosure are not necessarily limited thereto. For example, unlike the embodiment shown in FIG. 8, the first reflective surface 613*a* and the fourth reflective surface 613*d* may be formed in an equiangular trapezoid that has the second reflective surface 613*b* or the third reflective surface 613*c* as the base and has two interior angles (base angles) having the same size. When the lens assembly 600 is formed in an equiangular trapezoidal shape, an optical path similar to that of the embodiment in FIG. 6 may be formed. According to an embodiment, the reflective and/or refractive member 613 included in the lens assembly 600 may be formed to have a trapezoidal prism or mirror structure of one body, but multiple prisms or mirror pieces may be combined and/or coupled to form the reflective and/or refractive member 613 of a trapezoidal prism or mirror structure.

According to an embodiment, the lens assembly 600 may include multiple reflective and/or refractive member. For example, as illustrated in FIGS. 6 and 7, the lens assembly 600 may include at least two reflective and/or refractive member (e.g., the first reflective and/or refractive member 413 or 513 and the second reflective and/or refractive member 415 or 515) to refract or reflect light at least twice, thereby forming a first optical path. When the lens assembly 600 includes multiple reflective and/or refractive member (e.g., the first reflective and/or refractive member 413 or 513 and the second reflective and/or refractive member 415 or 515), at least one lens system (e.g., the second lens group 423 or 523 including the second lenses 423*a*, 423*b*, and 423*c* or 523*a* and 523*b* or the dummy member 423*d* in FIGS. 6 and 7) may be further included between the multiple reflective and/or refractive member.

In addition, although not illustrated in the drawing, the lens assembly 600 may further include the infrared blocking filter 519 described in FIG. 7. According to an embodiment, the lens assembly 600 may further include a lens system (e.g., a first lens group 621 including at least one first lens 621*a* or 621*b*) for guiding or focusing light IL incident from the outside onto the at least one reflective and/or refractive member 613. In an embodiment, the first lens group 621, or the first lens (e.g., the first lens 621*a*) disposed on a subject side in the lens assembly 600 may have positive refractive power. For example, as the first lens 621*a* is configured to focus or align light IL, which is incident from the outside, onto the at least one reflective and/or refractive member 613, an optical system ranging from the first lens 621 to the image sensor 611 may be miniaturized. In addition, when the lens assembly 600 includes the first lens group 621, a camera including this lens assembly may be referred to, for example, as a "lens lead-type camera". According to embodiments, the first lens group 621 may further include additional first lens(es) 621*b* in order to focus or align light incident from the outside.

Referring to FIG. 8, a trapezoidal prism or mirror structure (or a parallelogram prism or mirror structure) and a refractive optical system including the same may be designed such that light refracted or reflected by the first reflective surface 613*a*, the second reflective surface 613*b*, the third reflective surface 613*c*, and the fourth reflective surface 613*d*, that is, only light refracted or reflected 4 times, is incident on the image sensor. However, according to an embodiment, as illustrated in FIG. 8, at least part of the light refracted or reflected by the reflective and/or refractive member 613 may be incident on the image sensor 611 along a second optical path different from the first optical path. Here, the second optical path may be indicated by a dash-dotted line, and light traveling along the second optical path may follow paths indicated by "IL", "RL1'", and "RL2'" in FIG. 8. For example, in the trapezoidal prism or mirror structure (or parallelogram prism or mirror structure) and the refractive optical system including the same, light refracted or reflected by the first reflection surface 613*a* and the second reflection surface 613*b*, that is, light refracted or reflected twice, may be incident on the image sensor 611, an image acquired by such light may be output blurry, and the occurrence of such a phenomenon may be referred to, for example, as occurrence of flare.

The disclosure may provide various embodiments in which it is possible to determine whether the above-described flare has occurred and/or to compensate the flare. In order to determine whether the flare has occurred and/or to compensate the flare, the image sensor 611 may include multiple unit pixels for imaging light having passed through the lens assembly and converting the imaged light into an electrical signal, and a processor (e.g., an image signal processor 732 in FIG. 10 described below) electrically connected to the image sensor to output an image using the electrical signal.

The image sensor 611 of the disclosure will be described in more detail through embodiments in FIG. 8 described above and FIGS. 9 and 10 described below.

Figure 9:
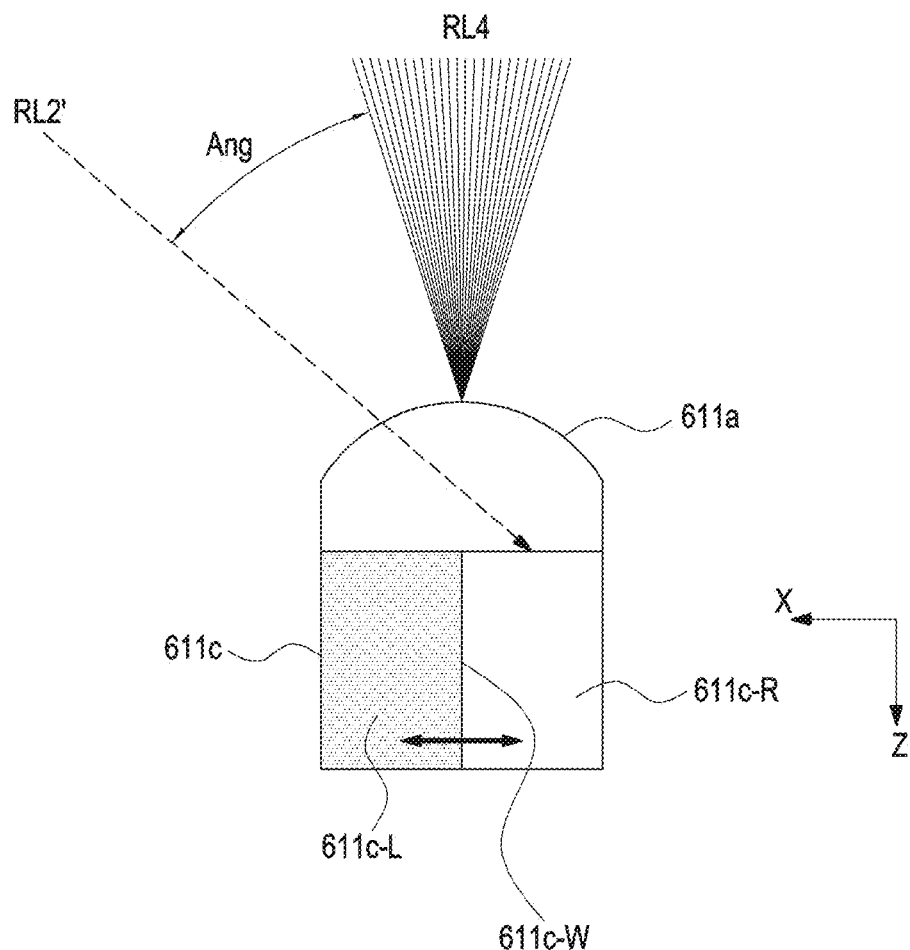
FIG. 9 illustrates a 2PD subpixel according to an embodiment.

FIG. 9 illustrates a 2PD subpixel according to an embodiment. FIG. 10 illustrates an image sensor including multiple subpixels according to various embodiments of the disclosure.

The image sensor 611 of the disclosure may include multiple pixels. The image sensor 611 may include hundreds, thousands, or tens of thousands to hundreds of millions of pixels. In FIG. 8, the image sensor 611 is disposed on a plane substantially parallel to the xy plane in the electronic device. However, the plane on which the image sensor 611 is disposed may be variously configured depending on various optical paths according to how many times and positions at which light traveling in the lens assembly 600 is refracted and/or reflected. For example, the position at which the image sensor 611 is disposed in the electronic device may be varied, such as a plane substantially parallel to the xy plane as well as a plane substantially perpendicular to the xy plane.

Referring to FIGS. 8 and 9, the image sensor 611 of the disclosure may include one micro lens 611a for each unit pixel included in the image sensor 611. The micro-lens 611a may play a role of refracting and/or focusing light. According to an embodiment, multiple micro-lenses 611a may be regularly arranged to form a micro-lens array. Although not illustrated in the drawings, the image sensor 611 may include a color filter which includes multiple colors of one or more kinds, is spatially divided, and is capable of selectively allowing light to pass. The color filter may be disposed behind the micro-lens with reference to a light movement path to allow light having a designated reference color, that is, light having a designated wavelength range, to pass therethrough. Multiple designated reference colors (e.g., red (R), green (G), and blue (B)) may be allocated to each of the multiple pixels included in the image sensor 611 through the color filter. Each of the multiple pixels may be designed to receive light having a wavelength range designated thereto. A light-receiving element (e.g., a photodiode, a pinned-photodiode, a phototransistor, or a photogate) may be disposed in each of the multiple pixels of the image sensor 611. When light reaches the light-receiving element, an electrical signal corresponding to the incident light may be output by a photoelectric effect. In addition, the electrical signal may generate charge (or current) according to the intensity (or amount) of the received light.

According to an embodiment, one micro-lens and one color filter may be disposed in a unit pixel, and one light-receiving element may be disposed behind the color filter. That is, one light-receiving element may be disposed in one unit pixel. According to an embodiment of the disclosure, one micro-lens and one color filter may be disposed in a unit pixel, and multiple light-receiving elements 611c may be disposed behind the color filter.

According to an embodiment, two, three, or four or more light-receiving elements may be disposed in a unit pixel. When two light-receiving elements are disposed in a unit pixel, the unit pixel structure may be referred to, for example, as a dual pixel structure (hereinafter, referred to as a "2PD pixel structure"). When three light-receiving elements are disposed in a unit pixel, the unit pixel structure may be referred to, for example, as a triple pixel structure (hereinafter, referred to as a "3PD pixel structure"). When four light-receiving elements are disposed in a unit pixel, the unit pixel structure may be referred to, for example, as a quad pixel structure (hereinafter, referred to as a "4PD pixel structure"). As such, in the disclosure, a case in which multiple (N) light-receiving elements are included in a unit pixel (or a case in which multiple (N) of light-receiving elements are included in each micro-lens) may be referred to, for example, as an "NPD pixel structure". In the embodiments in FIGS. 8 and 9, a 2PD pixel structure in which two light-receiving elements are disposed in a unit pixel is disclosed. Hereinafter, when a unit pixel includes two light-receiving elements, each light-receiving element may be referred to, for example, as a "sub pixel".

Multiple light-receiving elements included in each unit pixel may independently capture incident light as an image. In the process in which the multiple light-receiving elements independently capture the incident light as an image, the incident light may be output as a photoelectric conversion signal.

Referring back to FIGS. 8 and 9, the lens assembly 600 according to the disclosure is disposed such that a direction (e.g., the X direction) in which at least two subpixels of the image sensor are distinguished corresponds to the second optical path. Here, the fact that the distinct directions of the at least two subpixels correspond to the second optical path may refer, for example, to the arrangement direction (e.g., the X direction) of different subpixels being parallel to an imaginary line projected from the second optical path onto a plane where the image sensor is disposed (e.g., a plane parallel to the xy plane). At this time, the second optical path may be inclined by a predetermined angle (Ang) with respect to the first optical path. For example, the first optical path of light incident on the image sensor may be incident on the image sensor 611 along a path indicated as RL4, the second optical path may be incident on the image sensor 611 along a path indicated as RL2', and the image sensor 611 of the disclosure may include at least two subpixels 611c-L and 611c-R as multiple light-receiving elements 611c, and these two subpixels 611c-L and 611c-R may be arranged separately from each other in a direction corresponding to the second optical path direction. That is, when the second optical path is projected onto the image sensor, the two subpixels 611c-L and 611c-R may be separately disposed as two different parts along the X-axis direction parallel to the second optical path in one unit pixel. A real or imaginary partition wall 611c-W may be provided to distinguish subpixels, for example, at least two subpixels, from each other. At this time, when the second optical path passes, the partition wall 611c-W and the second optical path pass may form a predetermined angle (Ang).

FIGS. 10a, 10B, 10C, 10D, 10E, 10F, and 10G illustrate example image sensors including multiple subpixels according to various embodiments of the disclosure.

Figure 10A:
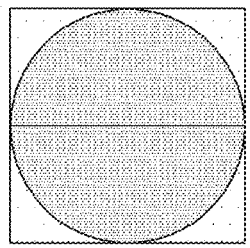
FIGS. 10A, 10B, 10C, 10D, 10E, 10F, and 10G illustrate image sensors including multiple subpixels according to various embodiments of the disclosure.
Figure 10B:
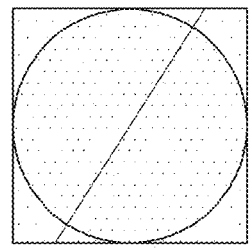
Figure 10C:
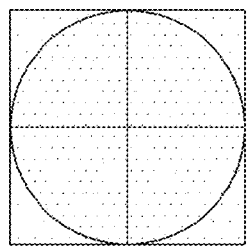
Figure 10D:
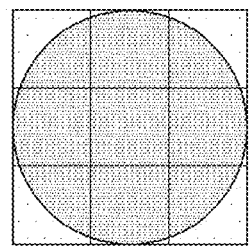
Figure 10E:
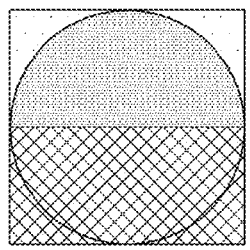
Figure 10F:
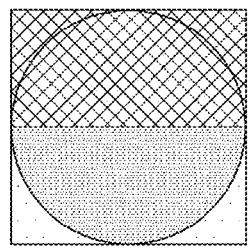
Figure 10G:
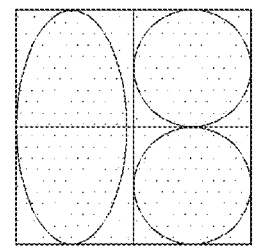

When multiple light-receiving elements are disposed in a unit pixel, elements having the same specifications may be disposed to be symmetrical (line-symmetrical or point-symmetrical) to each other with respect to the center of the unit pixel. For example, when two light-receiving elements are disposed in a unit pixel, the light-receiving elements may be disposed to be line-symmetrical to each other in left/right or top/bottom directions with respect to the center of the unit pixel. Referring to FIG. 10A, it is illustrated that in the unit pixel disposed in the image sensor 611, the subpixels 611c-L and 611c-R are separately disposed up/down (or left/right) directions, but the unit pixel does not necessarily have such a form. For example, as illustrated in FIG. 10B, a 2PD form having a slanted boundary is also possible. Also, the unit pixel of the image sensor 611 may have a form as illustrated in FIGS. 10C and 10D. As illustrated in FIGS. 10C and 10D, a unit pixel of the image sensor 611 may be formed in a structure in which the unit pixel includes 4 subpixels or 9 subpixels, that is, a 4PD pixel structure or a 9PD pixel structure. In addition, any PD form in which unit pixels of the image sensor 611 are separate from each other in the direction in which abnormal incident light (e.g., the second optical path (RL2' in FIG. 9)) causing flare to be incident may be applied. A unit pixel of the image sensor 611 may have an NPD pixel structure (wherein N is a square of a natural number greater than or equal to 4). For example, the unit pixel may include a 2PD pixel structure including a metal shield as illustrated in FIGS. 10E and 10F, and a 2×1 OCL (on-chip-lens lens) PD structure as illustrated in FIG. 10G.

Figure 11:
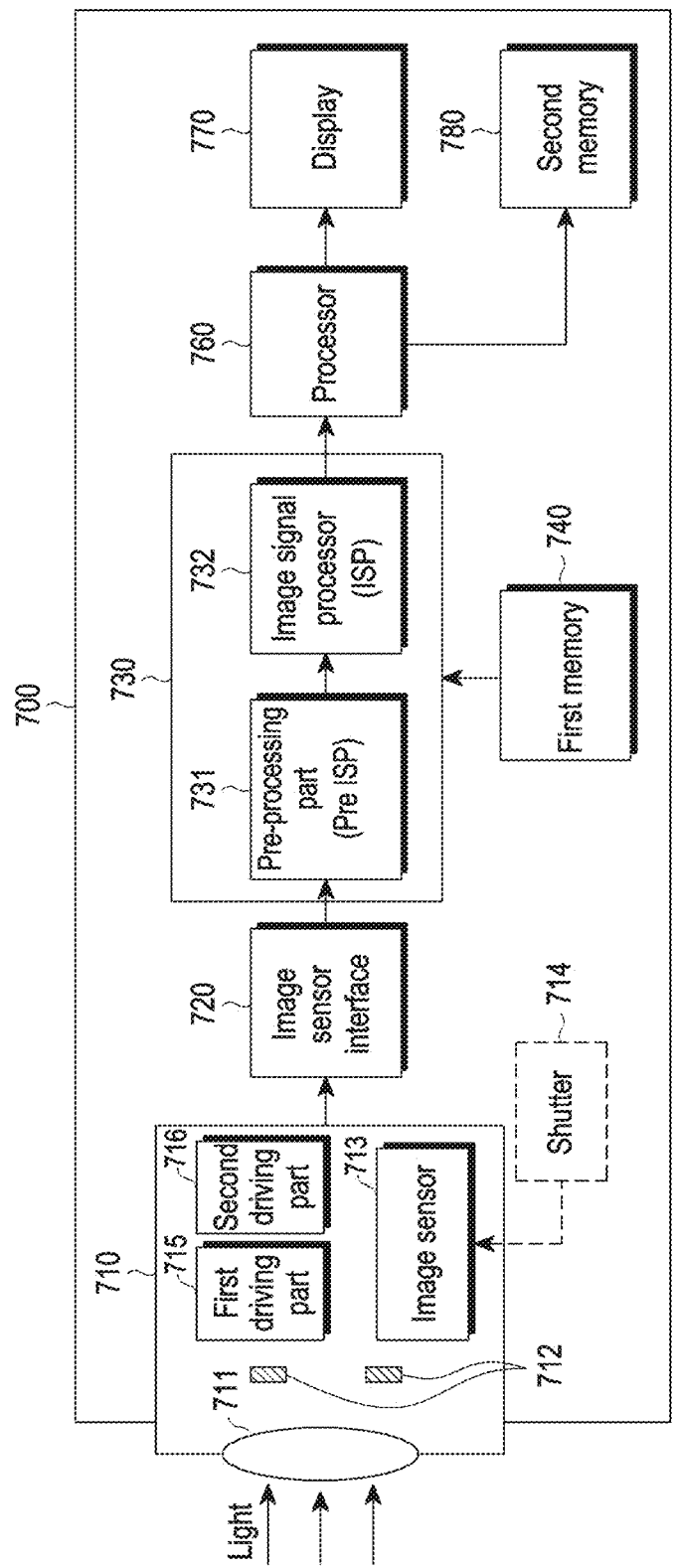
FIG. 11 is a block diagram illustrating constituent elements of an electronic device according to an embodiment.

FIG. 11 is a block diagram illustrating constituent elements of an electronic device 700 (e.g., the electronic device 101 in FIG. 1) according to various embodiments. The electronic device 700 according to an embodiment may collect light reflected from a subject to take a photograph (or video). The electronic device 700 may include an image capture part 710, an interface 720 (e.g., an image sensor interface), an image processing part 730, a first memory 740, a processor 760, a display 770, and a second memory 780. According to various embodiments, the image capture part 710 may constitute a camera module (e.g., the camera module 180 in FIG. 1), and the image signal processor 732 and the processor 760 may constitute at least one processor (e.g., the processor 120 in FIG. 1).

In an embodiment, the image capture part 710 may include a lens part 711, an aperture 712, an imaging element 713 (hereinafter, referred to as "image sensor 713"), a shutter 714, and driving parts 715 and 716.

In an embodiment, the lens part 711 may collect light reflected from a subject and reaching the electronic device 700. The lens part 711 includes at least one lens, and may be implemented as, for example, a lens assembly having multiple lenses aligned in an optical axis direction. In this case, the image capture part 710 may be, for example, a dual camera, a 360-degree camera, or a spherical camera. The lenses included in the lens assembly may have the same lens attributes (e.g., angle of view, focal length, auto focus, f number, or optical zoom), or at least one lens may have at least one different lens attribute from the other lenses. The lens assembly may include, for example, a wide-angle lens or a telephoto lens. The amount (light amount) of light collected through the lens part 711 may be adjusted through the aperture 712, and the light having passed through the aperture 712 may reach the image sensor 713. In the embodiment illustrated in FIG. 11, the aperture 712 is shown as an element separate from the lens part 711, but, unlike this, the aperture 712 may be integrated into the lens part 711.

In an embodiment, the image sensor 713 may include a pixel array in which multiple image pixels are two-dimensionally arranged in a lattice shape. One of multiple reference colors may be allocated to each of the multiple image pixels. According to various embodiments, the multiple reference colors may include, for example, red, green, and blue (RGB); red, green, blue, and white (RGBW); cyan, magenta, and yellow (CMY); cyan, magenta, yellow, and black (CMYK); red, yellow, and blue (RYB); or RGB infrared ray (RGBIR). Multiple micro-lenses may be disposed on a side close to the subject in the optical axis direction with reference to the multiple image pixels. The image sensor 713 may generate a digital signal (or electrical signal) based on light reflected from a subject, and may generate digital image data (hereinafter, referred to as "image data" for short) based on the electrical signal. The image sensor 713 may include, for example, an image sensor selected from among image sensors having different attributes, such as an RGB sensor, a black and white (BW) sensor, an IR sensor, or a UV sensor, multiple image sensors having the same attributes, or multiple image sensors having different attributes. For example, a charge coupled device (CCD) or a complementary metal oxide semiconductor (CMOS) may be used as the image sensor 713.

According to various embodiments, the image sensor 713 may include a photo diode PD, a transfer transistor TX (or a transfer gate), a reset transistor RX (or a reset gate), and a floating diffusion node FD. The photodiode PD may generate and accumulate a photo-charge corresponding to an optical image of a subject. The transfer transistor TX may transmit a photo-charge focused on the photodiode PD to the floating diffusion node FD in response to a transfer signal. The reset transistor RX may discharge a charge stored in the floating diffusion node FD in response to a reset signal. Before the reset signal is applied, the charge stored in the floating diffusion node (PD) is output. At this time, correlated double sampling (CDS) processing may be performed, and an analog signal on which the CDS processing has been performed may be converted into a digital signal through an analog-to-digital circuit (ADC) and/or an analog front end (AFE). An example of the image sensor 713 of the disclosure may be one in which four photodiodes are provided in a pixel corresponding to one micro-lens (e.g., a 4PD pixel).

In an embodiment, the shutter 714 may adjust a time during which the image sensor 713 is exposed to light. For example, when the shutter 714 operates slowly, a large amount of light may be incident on the image sensor 713, and when the shutter 714 operates quickly, a small amount of light may be incident on the image sensor 713.

In an embodiment, the driving parts 715 and 716 (each including, e.g., a driver) may be elements for adjusting the position of the lens part 711, the aperture 712, or the image sensor 713. The driving parts 715 and 716 may include a first driving part 715 and a second driving part 716. For example, the first driving part 715 may move the lens part 711 so as to be substantially parallel to the optical axis direction. The auto focusing (AF) operation of the image capture part 710 may be implemented through the first driving part 715, thereby adjusting the focus of the light imaged on the image sensor 713. In addition, for example, the second driving part 716 may adjust the position of the lens part 711 or the image sensor 714 to prevent shaking occurring during a user's manipulation of the image capture part 710. In response to the movement of the image capture part 710 or the electronic device 700 including the same, the second driving part 716 may move or perform control (e.g., read-out timing control, etc.) on the image sensor 713 or at least one lens included in the lens assembly in a specific direction in order to at least partially compensate for the negative effect (e.g., image shaking) of the movement on an image being captured. According to an embodiment, the second driving part 716 may be implemented as, for example, an image stabilizer or an optical image stabilizer, and may detect the movement by using a gyro sensor (not shown) or an acceleration sensor (not shown) disposed inside or outside the image capture part 710.

In an embodiment, the interface 720 (e.g., the image sensor interface including image sensor interface circuitry)

may be disposed between the image sensor 713 and the image processing part 730 to perform interfacing. Data output from the image sensor 713 through the interface 720 may be transmitted to the image processing part 730 (including, e.g., image processing circuitry). According to the configuration of the electronic device 700, the interface 720 may be included in the image processing part 730. Also, according to the configuration of the electronic device 700, the interface 720 may be omitted or another interface not illustrated in the drawing may be additionally provided.

In an embodiment, the memories 740 and 780, for example, may at least temporarily store at least a part of an image acquired through the image sensor 713 for a next image processing task, or may store commands or data related to at least one other constituent element (e.g., the image processing part 730) of the electronic device 700. For example, when image acquisition based on the shutter 714 is delayed or when multiple images are acquired at high speed, an acquired original image (e.g., a high-resolution image) may be stored in the memories 740 and 780, and a corresponding copy image (e.g., a low-resolution image) may be previewed through a display module (e.g., the display module 160 in FIG. 1). Thereafter, when a designated condition is satisfied (e.g., a user input or a system command), at least a part of the original image stored in the memory 740 or 780 may be acquired and processed by, for example, the image signal processor 732. According to an embodiment, the memories 740 and 780 may be formed as at least a part of a memory (e.g., the memory 130 in FIG. 1) of the electronic device 700 or a separate memory operated independently thereof.

According to an embodiment, the memories 740 and 780 may include the first memory 740 and the second memory 780 distinguished from each other as illustrated in FIG. 11. According to an embodiment, the first memory 740 may store at least one piece of compensation data (e.g., white balance compensation data, gamma compensation data, knee compensation data, etc.). For example, the at least one piece of compensation data may be stored in a lookup table (LUT) format. According to an embodiment, the second memory 780 may be a non-volatile memory (e.g., flash memory), and may store image data generated by the image processing part 730. In FIG. 11, for convenience of description, the memories 740 and 780 are illustrated as separate elements according to functions performed, but it should be noted that the memories are not necessarily limited to the illustration, and may be implemented as, for example, one element.

In an embodiment, the image processing part 730 may be an element for variously processing image data that has been output from the image sensor 713. With respect to an image acquired through the image sensor 713 or an image stored in a memory (e.g., the first memory 740), the image processing part 730 may perform image processing (e.g., depth map generation, three-dimensional modeling, panorama generation, feature point extraction, image synthesis, or image compensation (e.g., noise reduction, resolution adjustment, brightness adjustment, blurring, sharpening, or softening)). Additionally or alternatively, the image processing part 730 may perform control (e.g., exposure time control, read-out timing control, etc.) on at least one (e.g., the image sensor 713) of the constituent elements included in the image capture part 710. The image processed by the image processing part 730 may be stored again in the memory 740 or 780 for additional processing, or may be transmitted to a constituent element (e.g., the memory 130, the display module 160, the electronic device 102, the electronic device 104, or the server 108 in FIG. 1) outside the image capture part 710. According to an embodiment, the image processing part 730 may include a pre-processing part (e.g., Pre ISP) 731 (including, e.g., pre-processing circuitry) and the image signal processor (ISP) 732 (including, e.g., image signal processing circuitry). The pre-processing part 731 may perform a function such as image matching or gamma processing. For example, when there is shaking between multiple images that have been continuously photographed, the pre-processing part 731 may remove or reduce a shaking component through an image matching process. The image signal processor 732 may generate an entire image signal by compensating and synthesizing signals received from the pre-processing part 731. According to an embodiment, the pre-processing part 731 may be integrated with the image signal processor 732 to form the image processing part 730.

According to various embodiments, the image processing part 730 may be configured as at least a part of the processor 760 (e.g., the processor 120 in FIG. 1) or as a separate processor operated independently of the processor 760. For example, according to an embodiment, the pre-processing part 731 and the image signal processor 732 of the image processing part 730 may be integrated into the processor 760. In contrast, when the image processing part 730 is configured as a separate processor different from the processor 760, images processed by the image processing part 730 may be displayed through the display module 160 as they are or after additional image processing by the processor 760.

According to various embodiments, the image processing part 730 may generate a signal for controlling the lens part 711 or the image sensor 713, in addition to analyzing and calculating image data that has been output from the image sensor 713. For example, the image processing part 730 may generate a signal for controlling the first driving part 715 in order to move the lens part 711 in the optical axis direction, or may generate a signal for controlling the second driving part 716 in order to move the lens part 711 or the image sensor 713 to perform image stabilization.

In an embodiment, the processor 760 (e.g., the processor 120 in FIG. 1 and including e.g., processing circuitry) may include at least one of a central processing unit (CPU), an application processor (AP), or a communication processor (CP)). The processor 760 may execute, for example, calculations or data processing related to communication and/or control of at least one other element included in the electronic device 700. As described above, the processor 760 may include the image processing part 730 as at least a part of the processor 760 or may operate as a separate processor operated independently of the image processing part 730.

In an embodiment, the display 770 may include, for example, an LCD display, an LED display, an OLED display, a MEMS display, or an electronic paper display. The display 770 may display, for example, an image captured by the image capture part 710, an image having white balance compensated by the image processing part 730, and the like. According to various embodiments, the display 770 may include a touch screen, and may receive, for example, touch, gesture, proximity, or hovering input using an electronic pen or a part of a user's body. In describing the following embodiments, the pre-processing part 731 may be included in at least a part of the image signal processor 732, and accordingly, a description may be made on the assumption that the image signal processor 732 is substantially the same as the image processing part 730. In various embodiments of the disclosure, reference to "at least one processor" may refer to, for example, both a case in which the image processing part 730 is provided as at least a part of the processor 760 and a case in which the image processing part 730 is provided separately from the processor 760. In describing the following embodiments, the description may be made of an example in which the image signal processor 732 is a separate processor that operates independently of the processor 760. However, it should be noted that this is for convenience of description and does not limit a combination of the image processing part 730, the image signal processor 732, and the processor 760 according to various embodiments of the disclosure to any one form. According to an embodiment of the disclosure, the processor (e.g., the image processing part 730, the image signal processor 732, the processor 760, or a combination of at least two thereof) may acquire multiple electrical signals from at least two subpixels, may identify a ratio of the multiple electrical signals, and may determine whether flare occurs and/or may compensate the flare based on the identified ratio.

According to an embodiment, the memories (e.g., the first memory 740 and the second memory 780) may store in advance a lookup table (LUT) related to a ratio according to a direction predetermined based on the second optical path. When executed, the processor (e.g., the image processing part 730, the image signal processor 732, the processor 760, or a combination of at least two thereof) may determine whether flare occurs and/or may compensate the flare using the ratio and the LUT stored in the memory.

In addition, the processor (e.g., the image processing part 730, the image signal processor 732, the processor 760, or a combination of at least two thereof) may distinguish a saturated subpixel, based on multiple electrical signals acquired from at least two subpixels, and may differently perform calculation depending on the number of saturated subpixels. For example, when at least two subpixels in one unit pixel are all saturated, flare may be compensated using non-saturated unit pixels around the saturated unit pixels. In this case, when part of at least two subpixels in one unit pixel are saturated, flare may be compensated using a non-saturated subpixel, autofocusing (AF) information, and non-saturated unit pixels around the saturated subpixels.

Summarizing the above-described content, according to an embodiment of the disclosure, the processor (e.g., the image processing part 730, the image signal processor 732, the processor 760, or a combination of at least two thereof) may determine whether flare occurs due to refraction or reflection of light, only for a specific area of the image sensor in which light incident through the second optical path is received. As the light incident through the second optical path is received, at least one subpixel among the at least two subpixels may output a high gain compared with other subpixels, and the processor may identify a ratio of multiple electrical signals with reference to the subpixel outputting the high gain.

An example operation (control method) of determining whether a flare has occurred or compensating the flare may be as follows. The control operation may be basically divided into a calibration operation for determining whether flare occurs and a compensation operation for compensating, after the calibration operation, a video (or image) in which flare has occurred.

Figure 12:
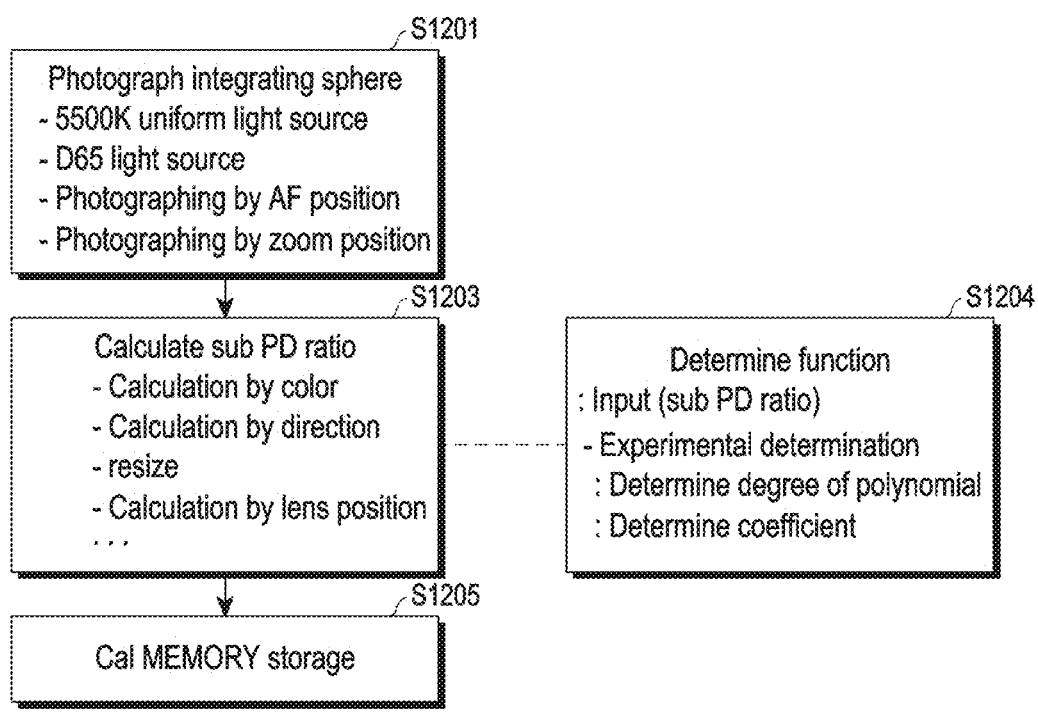
FIG. 12 illustrates a calibration operation according to an embodiment.
Figure 13:
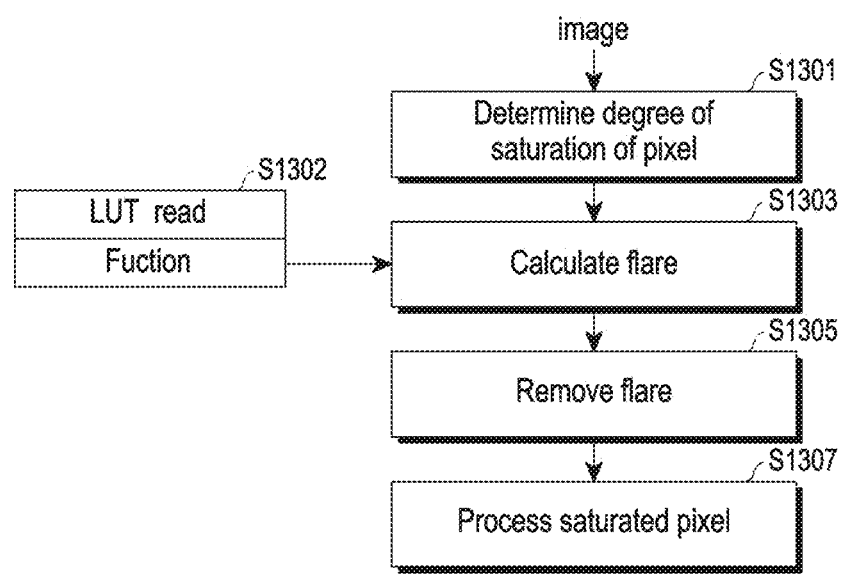
FIG. 13 illustrates a flare compensation method according to an embodiment.

FIG. 12 illustrates a calibration operation according to an embodiment. FIG. 13 illustrates a flare compensation method according to an embodiment.

A calibration operation and a compensation operation for a flare-generated video (or image) will be described in detail with reference to FIGS. 12 and 13.

Referring to FIG. 12, the calibration operation may include an operation S1201 of storing information about a flat light source such as a series of integrating spheres, and may include an operation S1203 of storing a ratio between subpixels (e.g., 611*c*-L and 611*c*-R).

For example, in relation to operation S1201, light source information according to various color temperatures (e.g., 5500K) may be stored as light source information of the integrating sphere. In another example, light source information regarding a standard light source (e.g., a D65 light source) may be stored as light source information of the integrating sphere. The integrating sphere may be photographed in order to store the light source information of the integrating sphere. For example, the integrating sphere may be photographed for each auto focusing (AF) position, and the integrating sphere may be photographed for each zoom position.

For example, in relation to operation S1203, a light source may output an amount of light sufficient to saturate a pixel, and another light source may output an amount of light to the extent that a pixel is not saturated. When an abnormal optical path that causes flare occurs even if a light source does not saturate the pixel, a gain difference may occur between subpixels (e.g., 611*c*-L and 611*c*-R). For example, in the embodiments in FIGS. 8 and 9, it may be expected that, in the case of a left subpixel 611*c*-L and a right subpixel 611*c*-R, the right subpixel 611*c*-R will receive a larger amount of light that may cause flare. That is, in one unit pixel, a gain difference between subpixels may occur, and a ratio thereof may be measured and/or stored. This ratio may vary depending on various reasons such as the color of a color filter of an image sensor, the direction of a subpixel, the position of the image sensor, the auto focusing (AF) position of a lens, or the position of the lens during zoom operation. In operation S1203, calculation of the ratio for each subpixel may be performed. According to an embodiment, information about these calculated values may be stored in a lookup table (LUT), and may be used to determine whether flare has occurred or to compensate the flare. The processor may use at least a part of the information stored in the LUT to determine whether flare has occurred and to determine whether to compensate the flare. According to an embodiment, since the processor can perform interpolation calculation, it is possible to properly select (e.g., resize) and store ratios of only some subpixels without storing ratios of subpixels included in all pixels of the image sensor. For example, in the 4PD pixel structure, 9PD pixel structure, etc. described with reference to FIG. 10, it is possible to obtain ratios in various phase difference directions including left/right and up/down directions, as well as a ratio in either direction of the left/right direction or the up/down direction. When the LUT is separately stored for each direction, a more accurate calculation of whether flare has occurred may be possible.

In relation to the calibration operation, a function for determining the amount of flare using the stored LUT as an input may be made in the memory (e.g., the first memory 740 and the second memory 780) (S1204).

For example, in relation to operation S1204, this function may be determined experimentally. For example, if this function is defined as a polynomial, coefficients of the polynomial may be experimentally stored in advance using the LUT ratio as an input. It may be difficult to predict whether flare will occur, but basically, when a unit pixel included in the image sensor is not saturated, it may be assumed that whether flare will occur has some correlation with the LUT ratio.

In relation to the calibration operation, instruction(s) related to information about a calculation value for a ratio of each subpixel and/or information about a function for determining the amount of flare may be stored in a memory (S1205). The calculation value for the ratio of each subpixel may be stored in the form of a lookup table (LUT).

Referring to FIG. 13, the flare compensation operation may first include an operation S1301 of determining the degree of saturation of an acquired image (or video). In addition, the amount of flare that occurs may be calculated based on the determination of the degree of saturation of a pixel (S1303).

In relation to operation S1301, since a saturated pixel outputs a signal different from an electrical signal that is output from a non-saturated pixel, a separate signal processing process may be required. In the pixel saturation determination, when a pixel is determined to be a saturated pixel, masking may be performed. According to an embodiment, even when only one subpixel among multiple subpixels included in a unit pixel of the image sensor is saturated, the unit pixel may be treated as a saturated pixel.

In relation to operation S1303, the function and LUT information (S1302) previously stored in the memory in the calibration operation may be used. The amount of flare that occurs for an input value may be calculated using the function and LUT stored in the calibration operation in FIG. 12. For example, referring to FIGS. 8 and 9, among the left subpixel 611c-L and the right subpixel 611c-R, the right subpixel 611c-R may have a greater amount of flare that occurs, wherein a normal signal of electrical signals output from the left subpixel 611c-L and the right subpixel 611c-R may be found by extracting the amount of flare experimentally obtained in the calibration operation step.

Next, the flare that has occurred may be removed through a flare removal operation S1305. The flare removal operation S1305 may include an operation S1307 of processing a saturated pixel.

In relation to operation S1307, when there is a saturated pixel, whether some of subpixels are saturated or all subpixels are saturated may be determined, and when all subpixels are determined to have been saturated, an original value may be inferred using another pixel, among non-saturated pixels, which is closest to the saturated pixel. According to an embodiment, the calculation may be performed by sequentially calculating the other non-saturated pixels from a pixel close to the saturated pixel to a pixel far from the saturated pixel. The pixel determined to be saturated by the processor may be processed as a saturated pixel, and the processor may use this information to perform learning for calculation on images to be acquired later. When information about the saturated pixel previously determined by the processor is no longer valid, the processor may perform learning (e.g., deep learning (DL)) or reduce the exposure of auto exposure (AE) to make the calculation more accurate in the next frame.

According to an embodiment, the processor may compensate flare in consideration of autofocusing (AF) information. For example, in a high-frequency domain where AF is out of focus, a gain difference between subpixels may occur due to AF defocus, thereby cause artifacts. Therefore, when AF is out of focus, flare may be compensated by taking AF information into account.

After the flare is compensated, the processor (e.g., the image processing part 730, the image signal processor 732, the processor 760, or a combination of at least two thereof) may remove an artifact of the saturated subpixel or an artifact therearound through gamma or clipping calculation.

For example, in the case of flare compensation, processing such as clipping and gamma compensation may be performed as the last step. Due to the gamma or clipping calculation, a dynamic range (DR) may be reduced, but a saturation-related artifact may be partially prevented (reduced).

Figure 14A:
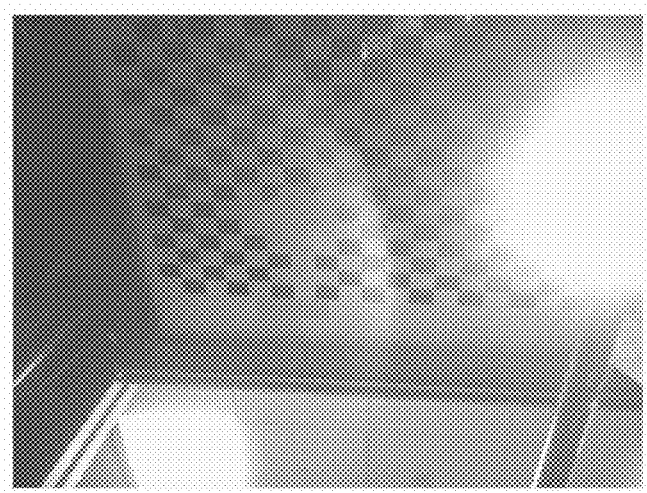
FIG. 14A is an actual view showing a flare phenomenon according to an embodiment.
Figure 14B:
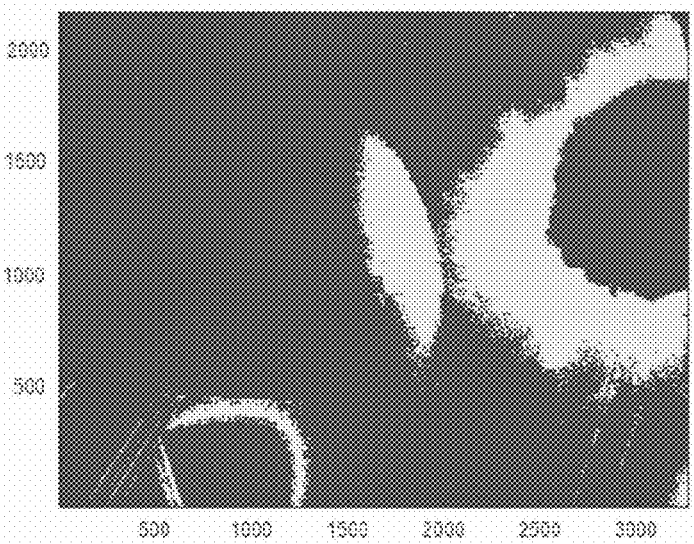
FIG. 14B illustrates the image in FIG. 14A displayed on a magenta background.
Figure 15:
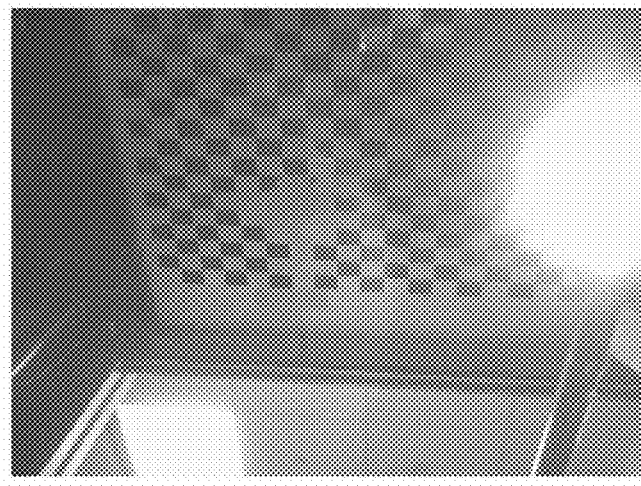
FIG. 15 illustrates an actual view to which flare compensation is applied according to an embodiment.

FIG. 14A is an actual view showing a flare phenomenon according to an embodiment. FIG. 14B illustrates the image in FIG. 14A displayed on a magenta background. FIG. 15 illustrates an actual view to which flare compensation is applied according to an embodiment.

FIG. 14B may show a portion, in which flare has occurred in an image illustrated in FIG. 14A, on a horizontal axis and vertical axis coordinate system regarding distance. Here, the flare that has occurred may include not only a flare due to refraction and/or reflection of light while the light passes through a reflective and/or refractive member, but also flare due to other causes.

Referring to FIG. 14A, flare may be detected in an actual captured image. The flare may occur around a light source and may occur due to various causes. Referring to FIG. 14B, flare may occur in a partial area of an image rather than the entire area of the image. From this, it is confirmed that the flare may be detected only in a specific area of an image sensor, but not in the entire area of the image sensor. The electronic device of the disclosure may include a processor, and the processor may perform at least one (e.g., the flare compensation operation) of the aforementioned operations to predict and calculate a flare caused by refraction and/or reflection of light while the light passes through the reflective and/or refractive member, thereby removing and/or reducing the flare occurring in a specific area of the image sensor. Accordingly, an image in which flare has been removed and/or reduced may be acquired as illustrated in FIG. 15 below.

According to an embodiment of the disclosure, an electronic device (e.g., electronic device 101, 200, 300, or 400) may include a lens assembly (e.g., lens assembly 500 or 600), an image sensor (e.g., image sensor 411, 511, or 611) including multiple unit pixels configured to convert the light passed through the lens assembly into an electrical signal, and a processor (e.g., the image processing part 730, the image signal processor 732, the processor 760, or a combination of at least two thereof) electrically connected to the image sensor to output an image by using the electrical signal. One unit pixel included in the multiple unit pixels may include a micro-lens (e.g., micro-lens 611a) and at least two subpixels (e.g., sub-pixels 611c-L and 611c-R) formed to correspond to the micro-lens. The processor may acquire multiple electrical signals from the at least two subpixels, may identify a ratio of the multiple electrical signals, and may determine, based on the identified ratio, whether flare is generated due to refraction or reflection of the light.

According to an embodiment, the flare may be compensated based on whether the flare is caused by the refraction or reflection.

According to an embodiment, the at least two subpixels may output different electrical signals depending on an incident angle of light incident through the micro-lens.

According to an embodiment, the lens assembly may include at least one reflective and/or refractive member (e.g., reflective and/or refractive member 413, 415, 513, 515, or 613) configured to refract or reflect the light.

According to an embodiment, at least a part of the light refracted or reflected by the reflective and/or refractive member may be incident on the image sensor along a second optical path different from a first optical path which is incident on the image sensor vertically.

According to an embodiment, a determination of whether flare is generated due to the refraction or reflection of the light may be performed only for a specific area of the image sensor in which the light incident along the second optical path is received.

According to an example embodiment, as the light incident along the second optical path is received, at least one of the at least two subpixels may output a higher gain than other subpixels, and the processor may identify a ratio of multiple electrical signals with reference to the subpixel outputting the higher gain.

According to an example embodiment, the electronic device may further include a memory configured to pre-store a lookup table (LUT) related to a ratio according to a direction predesignated based on the second optical path.

According to an example embodiment, at least two subpixels of the image sensor are distinguished in a direction corresponding to a second optical path.

According to an example embodiment, the processor may determine whether flare is generated and compensate the flare using the LUT stored in the memory and the identified ratio, when executed.

According to an embodiment, the processor may distinguish saturated subpixels based on the multiple electrical signals acquired from the at least two subpixels, and may compensate the flare depending on the number of saturated subpixels.

According to an embodiment, when all of at least two subpixels in one unit pixel are saturated, the processor may compensate the flare using a non-saturated unit pixel around the saturated unit pixel.

According to an embodiment, when part of at least two subpixels in one unit pixel are saturated, the processor may compensate the flare using a non-saturated subpixel, AF (autofocusing) information, and/or a non-saturated unit pixel around the saturated subpixel.

According to an embodiment, after the flare is compensated, the processor may remove an artifact of the saturated subpixel or an artifact therearound through gamma or clipping calculation.

According to an embodiment, the image sensor may have a micro-lens configuration including 2PD, 4PD, 9PD, NPD, metal shield, slanted 2PD, or 2×1 OCL PD.

An embodiment of the disclosure may provide a method for controlling an electronic device which includes a camera module including a lens assembly and an image sensor including multiple unit pixels, and a processor, wherein the method may include acquiring multiple electrical signals from at least two subpixels included in each of the multiple unit pixels, based on a ratio of light incident along a first optical path formed to be refracted at least twice in the lens assembly and a second optical path different from the first optical path, identifying a ratio of the multiple electrical signals, and determining, based on the identified ratio, whether flare is generated by refraction or reflection of the light, and compensate the flare.

In the disclosure, an embodiment has been illustrated and described. However, it should be understood that various embodiments are for illustrative purposes rather than for limiting the disclosure. It will be apparent to those skilled in the art that various changes may be made in the form and detailed configuration without departing from the overall scope of the disclosure, including the appended claims and equivalents thereof. For example, the shape, the type, and the number of reflective and/or refractive member included in the lens assembly of the disclosure and/or an electronic device including the lens assembly may vary depending on embodiments, and an optical path that is refracted or reflected while passing through the reflective and/or refractive member may vary depending on embodiments. The scope of the disclosure may encompass these various embodiments. It will also be understood that any of the embodiment(s) described herein may be used in conjunction with any other embodiment(s) described herein.

What is claimed is:

1. An electronic device comprising:
    a lens assembly, including at least one lens, and at least one reflector or refractor, which has a trapezoid shape, configured to refract or reflect light;
    an image sensor including multiple unit pixels configured to convert the light passed through the lens assembly into an electrical signal; and
    at least one processor, comprising processing circuitry, electrically connected to the image sensor to output an image based on the electrical signal,
    wherein at least a part of the light refracted or reflected by the reflector or refractor is incident on the image sensor along a second optical path different from a first optical path which is incident on the image sensor,
    wherein at least one unit pixel included in the multiple unit pixels comprises:
    a micro-lens; and
    at least two subpixels formed to correspond to the micro-lens and arranged in a direction corresponding to the second optical path, and
    wherein the at least one processor is configured to:
    acquire multiple electrical signals from the at least two subpixels;
    identify a ratio of the multiple electrical signals; and
    determine, based on the identified ratio, whether flare is generated due to refraction or reflection of the light.

2. The electronic device of claim 1, wherein the at least one processor is configured to:
    compensate the flare, based on the identified ratio.

3. The electronic device of claim 2, wherein the at least two subpixels are arranged in a direction corresponding to an incident angle of light incident through the micro-lens.

4. The electronic device of claim 1, wherein the at least one processor is configured to determine whether the flare is generated due to the refraction or reflection of the light only for a specific area of the image sensor in which the light incident along the second optical path is received.

5. The electronic device of claim 4, wherein, as the light incident along the second optical path is received, at least one of the at least two subpixels is configured to output a higher gain than other subpixels, and the at least one processor is configured to identify a ratio of multiple electrical signals with reference to the subpixel outputting the higher gain.

6. The electronic device of claim 4, further comprising a memory configured to pre-store a lookup table (LUT) related to a ratio according to a direction predesignated based on the second optical path.

7. The electronic device of claim 6, wherein the at least one processor is configured to, when executed, determine whether the flare is generated and compensate the flare using the LUT stored in the memory and the identified ratio.

8. The electronic device of claim 1, wherein the at least one processor is configured to:
    distinguish saturated subpixels based on the multiple electrical signals acquired from the at least two subpixels; and compensate the flare depending on a number of saturated subpixels.

9. The electronic device of claim 8, wherein the at least one processor is configured to compensate, in a case that each of the at least two subpixels in one unit pixel are saturated, the flare using a non-saturated unit pixel around the saturated unit pixel.

10. The electronic device of claim 8, wherein the at least one processor is configured to compensate, in a case that one or more of the at least two subpixels in one unit pixel are saturated, the flare using a non-saturated subpixel, AF (autofocusing) information, or a non-saturated unit pixel around the saturated subpixel.

11. The electronic device of claim 10, wherein the at least one processor is configured to remove an artifact of the saturated subpixel or an artifact therearound through gamma or clipping calculation after the flare is compensated.

12. The electronic device of claim 1, wherein the image sensor is configured to have a micro-lens configuration comprising 2PD, 4PD, 9PD, NPD, metal shield, slanted 2PD, or 2×1 OCL PD.

13. A method for controlling an electronic device comprising a camera comprising a lens assembly, at least one reflector or refractor, which has a trapezoid shape, configured to refract or reflect light, and an image sensor comprising multiple unit pixels; and at least one processor comprising processing circuitry, the method comprising:

acquiring multiple electrical signals from at least two subpixels included in each of the multiple unit pixels and arranged in a direction corresponding to a second optical path, based on a ratio of light incident along a first optical path in which the light is refracted or reflected at least twice in the lens assembly and the second optical path different from the first optical path;

identifying a ratio of the multiple electrical signals;

determining, based on the identified ratio, whether a flare is generated by refraction or reflection of the light; and compensate the flare.

14. The method of claim 13, further comprising:
determining whether the flare is generated or compensate the flare using a LUT stored in a memory and the identified ratio.

15. The method of claim 13, further comprising:
distinguishing saturated subpixels based on the multiple electrical signals acquired from the at least two subpixels; and compensating the flare depending on a number of saturated subpixels.

16. The method of claim 13, further comprising:
compensating, in a case that all of at least two subpixels in one unit pixel are saturated, the flare using a non-saturated unit pixel around the saturated unit pixel.

* * * * *